(12) United States Patent
Zhang et al.

(10) Patent No.: US 11,462,607 B2
(45) Date of Patent: Oct. 4, 2022

(54) DISPLAY SUBSTRATE, METHOD OF MANUFACTURING THE SAME AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Shun Zhang, Beijing (CN); Yonglin Guo, Beijing (CN); Yuan Yao, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 122 days.

(21) Appl. No.: 16/642,855

(22) PCT Filed: Aug. 22, 2019

(86) PCT No.: PCT/CN2019/102032
§ 371 (c)(1),
(2) Date: Feb. 27, 2020

(87) PCT Pub. No.: WO2020/063217
PCT Pub. Date: Apr. 2, 2020

(65) Prior Publication Data
US 2021/0167164 A1 Jun. 3, 2021

(30) Foreign Application Priority Data
Sep. 29, 2018 (CN) .......................... 201811155577.4

(51) Int. Cl.
*H01L 27/32* (2006.01)
*H01L 51/56* (2006.01)

(52) U.S. Cl.
CPC .......... *H01L 27/3279* (2013.01); *H01L 51/56* (2013.01); *H01L 2227/323* (2013.01)

(58) Field of Classification Search
CPC H01L 27/3279; H01L 2227/323; H01L 51/56
(Continued)

(56) References Cited

U.S. PATENT DOCUMENTS 10,135,020 B1 11/2018 Zhang et al.
10,541,257 B2 1/2020 Li et al.
(Continued)

FOREIGN PATENT DOCUMENTS

CN 104576682 A 4/2015
CN 104952888 A 9/2015
(Continued)

OTHER PUBLICATIONS

English Machine Translation of CN 108336120 (Year: 2018).*
(Continued)

*Primary Examiner* — Dzung Tran
(74) *Attorney, Agent, or Firm* — Kinney & Lange, P.A.

(57) ABSTRACT

A display substrate includes: a base substrate having a display area and a peripheral area surrounding the display area; an electroluminescent device disposed on the base substrate and located in the display area, the electroluminescent device including an anode, an electroluminescent layer, and a cathode disposed in this order on the base substrate; a negative power line disposed on the base substrate and located in the peripheral area, the negative power line extending along a side of the base substrate and being electrically connected to the cathode; and an insulating layer between the base substrate and the negative power line, a
(Continued)

side of the insulating layer close to the negative power line being provided with at least a trench. The trench is located in the peripheral area and extends in an extending direction of the negative power line, a part of the negative power line being located in the trench.

12 Claims, 12 Drawing Sheets

(58) Field of Classification Search
 USPC .......................................................... 257/66
 See application file for complete search history.

(56) References Cited

U.S. PATENT DOCUMENTS

| | | | |
|---|---|---|---|
| 2005/0117105 A1 | 6/2005 | Kang et al. | |
| 2008/0079360 A1* | 4/2008 | Kubota | H05B 33/04 313/505 |
| 2011/0006972 A1* | 1/2011 | Tanaka | H01L 27/3276 345/76 |
| 2011/0210348 A1* | 9/2011 | Yuasa | H01L 51/5259 438/28 |
| 2012/0062107 A1* | 3/2012 | Fujimura | H05B 33/04 313/504 |
| 2014/0145155 A1* | 5/2014 | Park | H01L 27/3244 257/40 |
| 2015/0014672 A1* | 1/2015 | Yamae | H01L 51/5237 257/40 |
| 2016/0141545 A1 | 5/2016 | Kim | |
| 2016/0240598 A1 | 8/2016 | You | |
| 2016/0358939 A1 | 12/2016 | Lee et al. | |
| 2017/0365217 A1 | 12/2017 | An et al. | |
| 2018/0130856 A1 | 5/2018 | Kim et al. | |
| 2018/0241001 A1 | 8/2018 | Park | |
| 2019/0305003 A1 | 10/2019 | Tan et al. | |

FOREIGN PATENT DOCUMENTS

| | | |
|---|---|---|
| CN | 106775124 A | 5/2017 |
| CN | 107068727 A | 8/2017 |
| CN | 107393906 A | 11/2017 |
| CN | 107479282 A | 12/2017 |
| CN | 107910349 A | 4/2018 |
| CN | 207352892 U | 5/2018 |
| CN | 108336120 A | 7/2018 |
| CN | 108461530 A | 8/2018 |
| KR | 20040110932 A | 12/2004 |

OTHER PUBLICATIONS

International Search Report and Written Opinion dated Aug. 22, 2019, for corresponding PCT Application No. PCT/CN2019/102032.

First Chinese Office Action dated Nov. 2, 2021, received for corresponding Chinese Application No. 201811155577.4. pp. 42.

Supplementary European Search Report dated Jul. 22, 2022, received for corresponding European Application No. 19858713.1, pp. 7.

\* cited by examiner

DISPLAY SUBSTRATE, METHOD OF MANUFACTURING THE SAME AND DISPLAY DEVICE

CROSS-REFERENCE TO RELATED APPLICATION(S)

This application is a Section 371 National Stage Application of International Application No. PCT/CN2019/102032, filed on Aug. 22, 2019, and claims the benefit of Chinese Patent Application No. 201811155577.4 filed on Aug. 29, 2018 in the National Intellectual Property Administration of China, the whole disclosure of which is incorporated herein by reference.

TECHNICAL FIELD

The present disclosure relates to the field of display technology, and in particular, to a display substrate, a method of manufacturing the same, and a display device.

BACKGROUND

Existing organic light emitting devices include an active matrix (abbreviated as AM) manner or a passive matrix (abbreviated as PM) manner. In these two types of organic light emitting display devices, there are strict requirements for a resistance value of a conductive wire. In order to make the resistance value of the conductive wire small, a wide conductive wire is usually used. However, the conductive wire is generally arranged in a non-display area of a display screen. An excessively wide conductive wire will increase an area of the non-display area, which is not conducive to the realization of a display device with a narrow frame.

SUMMARY

Some embodiments of the present disclosure provide a display substrate comprising: a base substrate comprising a display area and a peripheral area surrounding the display area; an electroluminescent device disposed on the base substrate and located in the display area, the electroluminescent device comprising an anode, an electroluminescent layer, and a cathode disposed in this order on the base substrate; a negative power line disposed on the base substrate and located in the peripheral area, the negative power line extending along a side of the base substrate and being electrically connected to the cathode; and an insulating layer between the base substrate and the negative power line, a side of the insulating layer close to the negative power line being provided with at least a trench, wherein the trench is located in the peripheral area and extends in an extending direction of the negative power line, and a part of the negative power line is located in the trench.

In some embodiments, an orthographic projection of the trench on the base substrate falls within an orthographic projection of the negative power line on the base substrate.

In some embodiments, the negative power line surrounds the display area, and the trench surrounds the display area.

In some embodiments, the negative power line comprises a first segment of negative power line, a second segment of negative power line, and a third segment of negative power line which are successively arranged in sequence, and the side of the base substrate comprises a first side, a second side and a third side which are successively arranged in sequence, the first segment of negative power line extends along the first side of the base substrate, the second segment of negative power line extends along the second side of the base substrate, and the third segment of negative power line extends along the third side of the base substrate; wherein the trench comprises a first segment of trench, a second segment of trench, and a third segment of trench which are successively arranged in sequence, the first segment of trench extends in an extending direction of the first negative electrode power line, and the second segment of trench extends in an extending direction of the second segment of negative power line, and the third segment of trench extends in an extending direction of the third segment of negative power line.

In some embodiments, the side of the insulating layer closed to the negative power line is provided with a plurality of trenches, and the plurality of trenches are arranged at intervals in a first direction parallel to the base substrate, the first direction is perpendicular to the side of the base substrate, and the plurality of trenches are parallel to each other.

In some embodiments, the plurality of trenches have the same width and are arranged at equal intervals.

In some embodiments, in a cross section of the negative power line perpendicular to the side of the base substrate, the negative power line comprises a first portion and a second portion, the first portion extends in a first direction parallel to the base substrate and perpendicular to the side of the base substrate, and second portion extends in a second direction perpendicular to the base substrate, the first portion is located at a bottom of the trench, and the second portion is located on a sidewall of the trench.

In some embodiments, the negative power line further comprises a third portion extending in the first direction, the third portion is located on the insulating layer, and is not located in the trench, the second portion connects the first portion with the third portion.

In some embodiments, the trench penetrates the insulating layer.

In some embodiments, the display substrate further comprising a metal layer disposed between the base substrate and the insulating layer and located in the peripheral area, wherein the negative power line is electrically connected to the metal layer at the trench.

In some embodiments, the insulating layer comprises at least one of a barrier layer, a buffer layer, a first insulating layer, a second insulating layer, and an interlayer dielectric layer which are sequentially disposed on the base substrate.

In some embodiments, the display substrate further comprising a thin film transistor disposed on the base substrate and located in the display area, the thin film transistor comprising a source-drain layer, wherein the negative power line and the source-drain layer are located in the same layer and are formed of the same material.

In some embodiments, the display substrate further comprising: a conductive layer disposed on the negative power line and located in the peripheral area, wherein, the conductive layer electrically connects the cathode with the negative power line.

In some embodiments, the conductive layer and the anode are located in the same layer and are formed of the same material.

Some embodiments of the present disclosure provide a display device comprising the display substrate according to the above embodiments.

Some embodiments of the present disclosure provide a method of manufacturing a display substrate, comprising: providing a base substrate comprising a display area and a peripheral area surrounding the display area; forming an insulating layer on the base substrate; forming at least a trench in the insulating layer, the trench being located in the peripheral area; and forming a negative power line on the insulating layer and in the trench.

In some embodiments, the display substrate further comprises an electroluminescent device disposed on the base substrate and located in the display area, the electroluminescent device comprises an anode, an electroluminescent layer, and a cathode disposed in this order on the base substrate, the method further comprises: forming a conductive layer on the negative power line, wherein the conductive layer and the anode are formed of the same material using the same patterning process.

In some embodiments, the method further comprising: forming a cathode layer on the conductive layer, wherein the cathode layer and the cathode are formed of the same material using the same patterning process, and the cathode layer is electrically connected to the cathode.

BRIEF DESCRIPTION OF THE DRAWINGS

Other objects and advantages of the present disclosure will be apparent from the following description of the present disclosure with reference to the accompanying drawings, which may help to have a comprehensive understanding of the present disclosure.

Figure 1A:
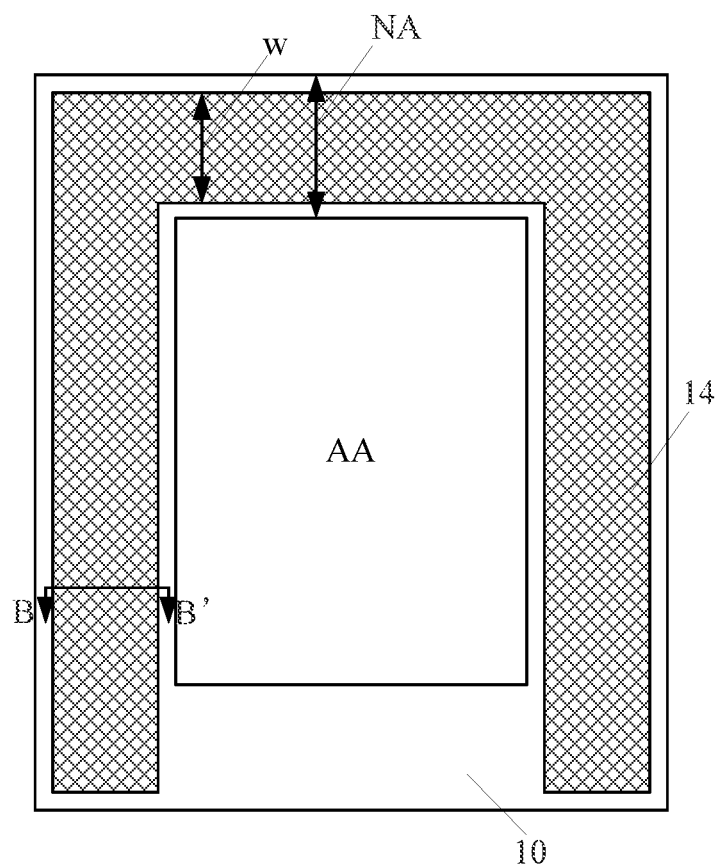
FIG. 1A is a plan view of a display substrate in the related art.

It should be noted that, for the sake of clarity, the dimensions of layers, structures or regions may be enlarged or reduced in the drawings for describing the embodiments of the present disclosure, that is, these drawings are not drawn to actual scale.

DETAILED DESCRIPTION OF THE EMBODIMENTS

The technical solutions of the present disclosure will be further described in detail through embodiments and the accompanying drawings. In the description, the same or similar reference numerals indicate the same or similar components. The following description of the embodiments of the present disclosure with reference to the drawings is intended to explain the general inventive concept of the present disclosure, and should not be construed as a limitation to the present disclosure.

In addition, in the following detail description, for ease of explanation, many specific details are set forth to provide a comprehensive understanding of the embodiments of the present disclosure. Obviously, however, one or more embodiments may be implemented without these specific details.

It should be noted that the terms "on", "formed on" and disposed on" cited in this article may mean that one layer is directly formed or disposed on another layer, or may mean that one layer is indirectly formed or disposed on another layer, that is, there are other layers between the two layers.

It should be noted that, although the terms "first", "second" and the like may be used herein to describe various components, members, elements, regions, layers, and/or portions, these components, members, elements, regions, layers, and/or portions should not be limited by these terms. These terms are used to distinguish one component, member, element, region, layer, and/or portion from another. Thus, for example, a first component, a first member, a first element, a first region, a first layer, and/or a first portion discussed below may be referred to as a second component, a second member, a second element, a second region, a second layer, and/or second portion without departing from the teachings of the present disclosure.

Herein, various layers of the display substrate such as a barrier layer, a buffer layer, a first insulating layer, a second insulating layer, an interlayer dielectric layer, and an insulating layer are described. Those skilled in the art should understand that these layers are generally formed of an insulating material, thus, without special distinction, the expression "insulating layer" may be used as their common name, that is, the expression "insulating layer" may include at least one of the barrier layer, the buffer layer, the first insulating layer, the second insulating layer and the interlayer dielectric layers. For example, the expression "insulating layer" may include the interlayer dielectric layer; or the expression "insulating layer" may include two layers of the interlayer dielectric layer and one of the first insulating layer and a second insulating layer; or the expression "insulating layer" may include three layers of the first insulating layer, the second insulating layer, and the interlayer dielectric layer; or the expression "insulating layer" may include four layers of the buffer layer, the first insulating layer, and the second insulating layer and the interlayer dielectric layer; or the expression "insulating layer" may include five layers of the barrier layer, the buffer layer, the first insulating layer, the second insulating layer, and the interlayer dielectric layer.

Figure 1B:
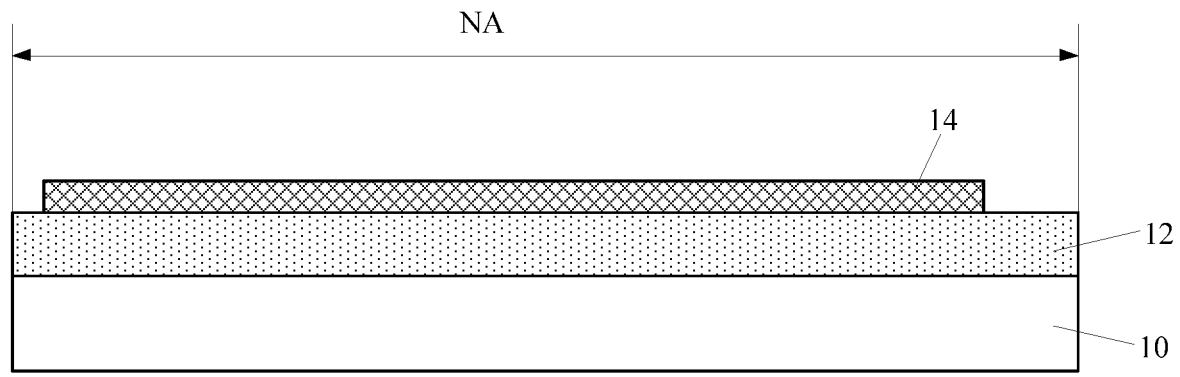
FIG. 1B is a cross-sectional view taken along a B-B' direction in FIG. 1A.

As shown in FIGS. 1A and 1B, a display substrate in the related art is shown, and in particular, a conductive wire of the display substrate in the related art is shown. FIG. 1A is a plan view of the display substrate, and FIG. 1B is a cross-sectional view taken along a B-B' direction in FIG. 1A. As shown in FIG. 1A, the display substrate includes a base substrate 10 including a middle area AA and a peripheral area NA surrounding the middle area AA. It can be understood that the middle area AA corresponds to a display area, which is used for displaying image, of a display device including the display substrate, and the peripheral area corresponds to a non-display area of the display device. For convenience of description, in this text, the middle area AA is referred to as a display area AA of the base substrate 10 and/or the display substrate, and the peripheral area is referred to as a non-display area NA of the base substrate 10 and/or the display substrate. As shown in FIG. 1B, the display substrate further includes: an insulating layer 12 disposed on the base substrate 10 and located at least in the non-display area NA; and a conductive wire 14, such as a negative power line, disposed on the insulating layer 12 and located in the non-display area NA. As shown in FIGS. 1A and 1B, the conductive wire 14 surrounds the display area AA. Specifically, the conductive wire 14 extends along a side of the base substrate 10 and occupies three edges of the base substrate 10. There may be other layers between the insulating layer 12 and the base substrate 10, for example, the insulating layer 12 may be an interlayer dielectric layer.

It should be noted that, in order to highlight the conductive wire, other structures or other layers are omitted in the plan view. For example, in FIG. 1A, the insulating layer 12 is omitted.

As shown in FIG. 1B, the conductive wire 14 are completely laid on the insulating layer 12. In order to make the resistance value of the conductive wire 14 small, it is generally necessary to set a width of the conductive wire 14, (i.e., a width w indicated in the figure) to be large. For example, taking the display substrate as an OLED display substrate as an example, the conductive wire 14 may be a negative power line for supplying a cathode (i.e., a VSS conductive wire), and the width w of the conductive wire 14 is generally 200 μm or more. However, the wide conductive wire 14 needs to occupy a large space in the non-display area, which is not conducive to the realization of a display device with a narrow frame.

Figure 2:
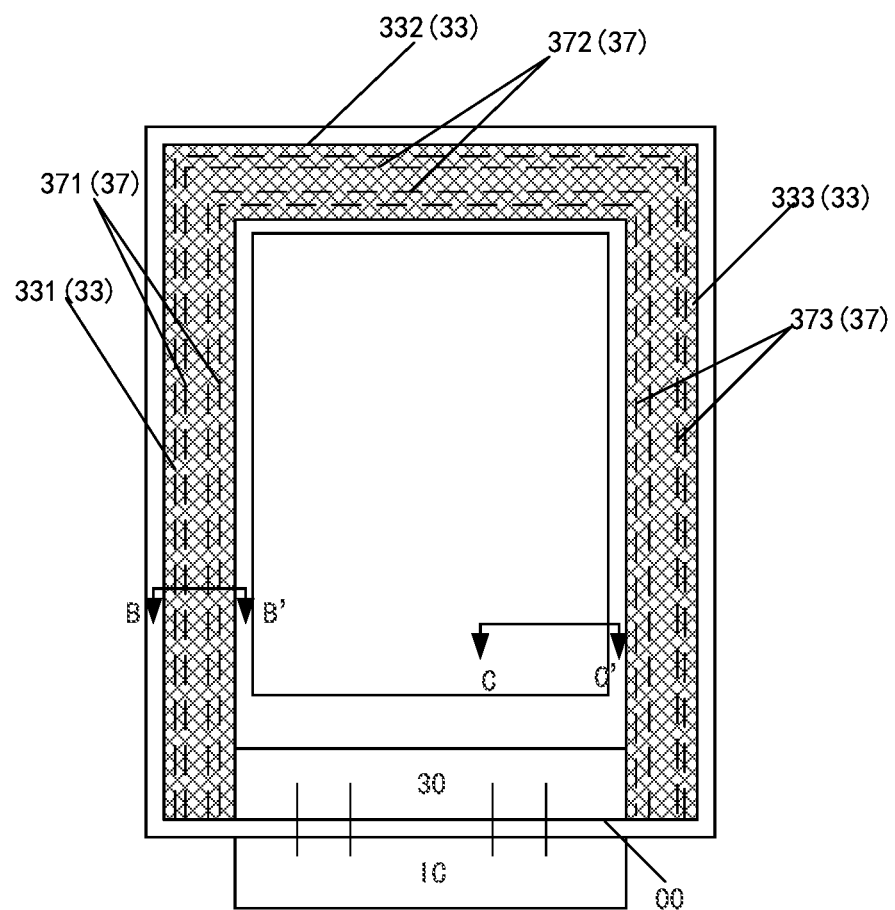
FIG. 2 is a plan view of a display substrate according to some embodiments of the present disclosure.

Based on this, some embodiments of the present disclosure provide a display substrate. As shown in FIG. 2, a plan view of a display substrate according to some embodiments of the present disclosure is shown. The display substrate includes a base substrate 00 including a display area AA and a non-display area NA surrounding the display area AA.

In the following, an OLED display device is taken as an example to describe the display substrate according to some embodiments of the present disclosure. However, those skilled in the art should understand that the embodiments of the present disclosure are not limited to the OLED display device, for example, they may be other electroluminescent display devices such as a polymer light emitting diode (PLED) display device or the like.

It should be understood that the display substrate includes: a plurality of organic light emitting devices located in the display area AA; and a conductive wire 33, such as a negative power line, located in the non-display area NA. A plurality of organic light emitting devices are disposed in the display area AA, and each organic light emitting device includes an anode, an organic light emitting layer, and a cathode disposed on the substrate in sequence. The conductive wire 33, such as a negative power line, extends along a side of the base substrate and is electrically connected to the cathode so as to provide a VSS voltage to the cathode. The organic light emitting devices and the conductive wire will be described in more detail below with reference to the drawings. The display substrate further includes: an electrical connection portion (pad) 30 located in the non-display area NA. The electrical connection portion 30 may be electrically connected to an integrated circuit IC, and the conductive wire is used to electrically connect an electrode (such as a cathode) of the organic light emitting device to the electrical connection portion 30, and then to the integrated circuit IC.

Specifically, as shown in FIG. 2, the conductive wire 33 is, for example, a negative power line, and includes a first segment of negative power line 331, a second segment of negative power line 332, and a third segment of negative power line 333. The first segment of negative power line 331 extends along a first side of the base substrate 10, such as a left side; the second segment of negative power line 332 extends along a second side of the base substrate 10, such as an upper side; and the third segment of negative power line 333 extends along a third side of the base substrate 10, such as a right side. The conductive wire 33 extends continuously as a whole, and the second segment of negative power line 332 connects the first segment of negative power line 331 with the third segment of negative power line 333.

As shown in FIG. 2, the display substrate further includes an insulating layer disposed between the base substrate 00 and the conductive wire 33. A trench 37 is provided on a side of the insulating layer close to the conductive wire 33. The trench 37 extends in an extending direction of the conductive wire 33, the number of the trench 37 is one or more, and at least a part of the conductive wire 33 is located in the trench 37. Compared with the related art described in FIG. 1A, within a predetermined frame width, the overall width of the conductive wire 33 in the embodiments may be wider, which enhances the conductive performance.

As shown in FIG. 2, the trench 37 is provided around the display area AA, and includes a first segment of trench 371, a second segment of trench 372, and a third segment of trench 373. The first segment of trench 371 extends in an extending direction of the first segment of negative power line 331, the second segment of trench 372 extends in an extending direction of the second segment of negative power line 332, and the third segment of trench 373 extends along in an extending direction of the third segment of negative power line 333.

In other embodiments, the trench 37 may include only one or two of the first segment of trench 371, the second segment of trench 372, and the third segment of trench 373.

When there are a plurality of trenches 37, they are parallel to each other, and they are spaced apart from each other in a direction from the non-display area NA toward the display area AA. The widths of the plurality of trenches may be the same or different, and intervals between two adjacent trenches can be the same or different.

In some embodiments, an orthographic projection of each trench 37 on the base substrate 00 falls within an orthographic projection of the conductive wire 33 on the base substrate 00.

As shown in FIG. 2, each trench 37 is continuous. In other embodiments, at least one trench 37 may be discontinuous.

The following specifically explains the present disclosure will be specifically explained with reference to specific embodiments. In different embodiments, FIG. 2 corresponds to different cross-sectional views.

Figure 3:
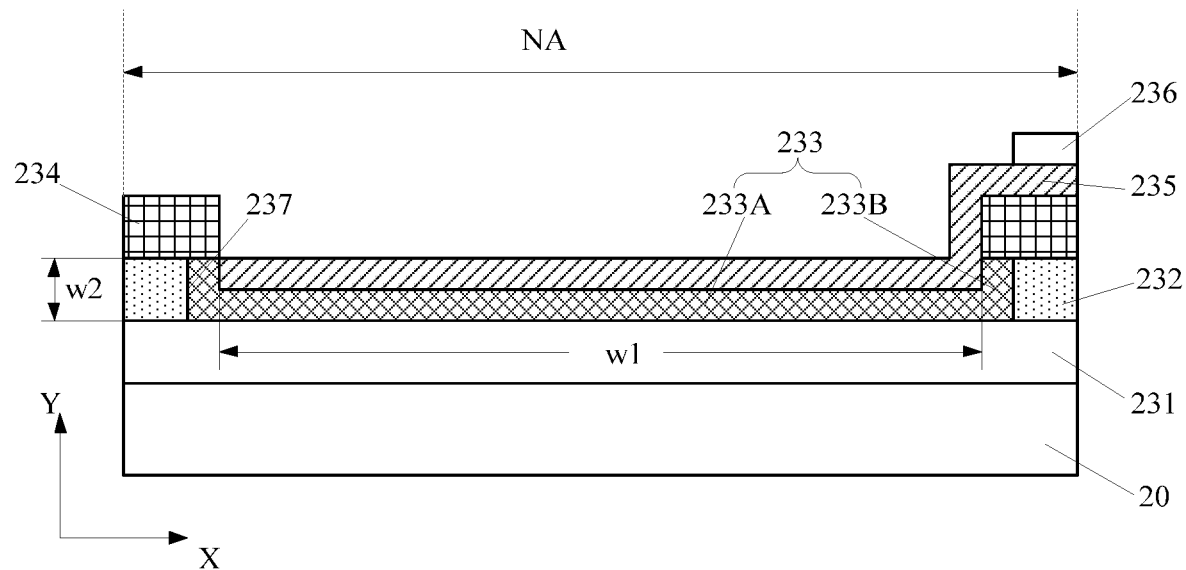
FIG. 3 is a cross-sectional view taken along a B-B' direction in FIG. 2, which shows a cross-sectional structure in a non-display area on one side of the display substrate.
Figure 4:
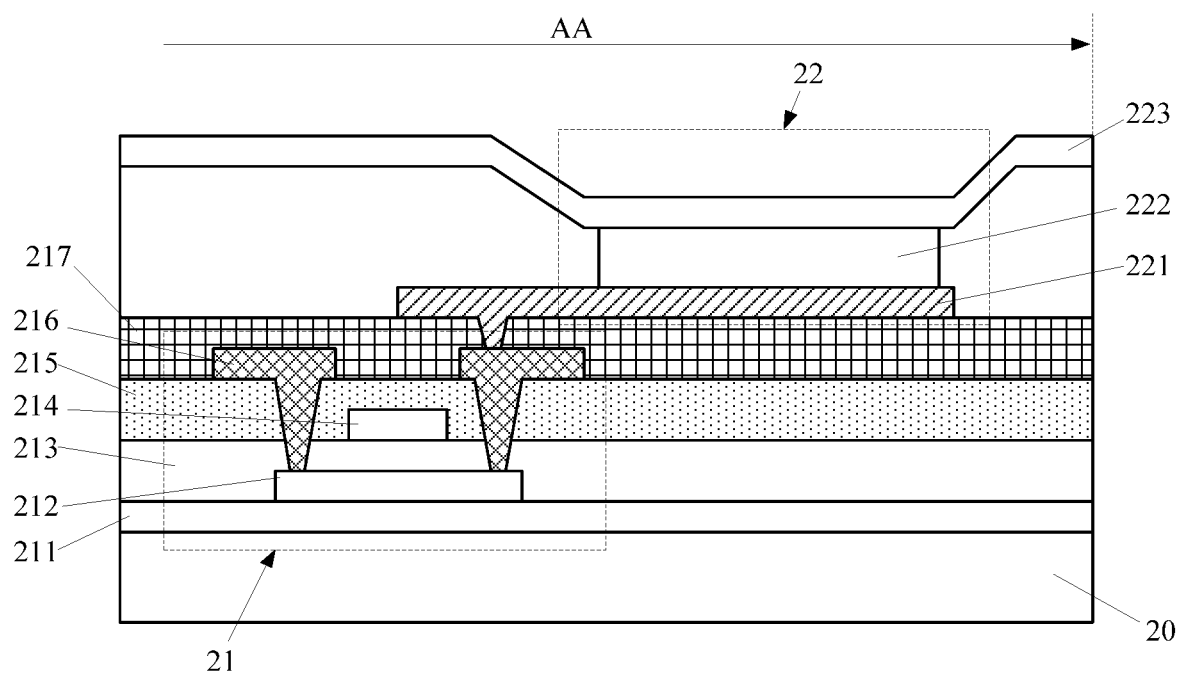
FIG. 4 is a cross-sectional view taken along a C-C' direction in FIG. 2, which shows a partial cross-sectional structure in a display area of the display substrate.

In some embodiments, FIG. 3 is a cross-sectional view taken along the B-B' direction in FIG. 2, which shows a cross-sectional structure of the non-display area NA of the display substrate; FIG. 4 is a cross-sectional view taken along the C-C' direction in FIG. 2, which shows a cross-sectional structure of the display area AA of the display substrate.

Optionally, as shown in FIG. 4, the display substrate includes a thin film transistor 21. Specifically, the thin film transistor 21 may include: a buffer layer 211, an active layer 212, a gate insulating layer 213, a gate layer 214, an interlayer dielectric layer 215, a source-drain layer 216 and a planarization layer 217 which are disposed on the base substrate 20 and located in the display area AA. The display substrate further includes a plurality of organic light emitting devices 22 located in the display area AA. The organic light emitting device 22 may be an organic light emitting diode. As shown in FIG. 4, the organic light emitting device 22 may include an anode 221, a light emitting layer 222 and a cathode 223 which are disposed on the base substrate 20 and located in the display area AA. The anode 221 of the organic light emitting device 22 may be electrically connected to a drain electrode of a driving transistor.

Optionally, referring to FIG. 2 and FIG. 3, the display substrate includes: a metal layer 231, an insulating layer such as an interlayer dielectric layer 232, a conductive wire 233, a planarization layer 234, a conductive layer 235, and a cathode layer 236 which are disposed on the base substrate 20 and located in the non-display area NA. The metal layer 231, the interlayer dielectric layer 232, the conductive wire 233, the planarization layer 234, the conductive layer 235 and the cathode layer 236 are sequentially disposed on the base substrate 20.

For example, the metal layer 231 may be located in the same layer and made of the same material as the gate layer 214, that is, it should be understood that the metal layer 231 in the non-display area NA is not electrically connected with the gate layer 214 in the display area AA. The interlayer dielectric layer 232 may be located in the same layer and made of the same material as the interlayer dielectric layer 215, that is, the interlayer dielectric layer 232 in the non-display area NA and the interlayer dielectric layer 215 in the display area AA may be formed as the same film layer. The planarization layer 234 may be located in the same layer and made of the same material as the planarization layer 217, that is, the planarization layer 234 located in the non-display area NA and the planarization layer 217 located in the display area AA may be formed as the same film layer.

Optionally, the conductive wire 233 may be located in the same layer and made of the same material as the source-drain layer 216. The conductive layer 235 may be located in the same layer and made of the same material as the anode 221 of the organic light emitting device 22. It should be understood that the conductive layer 235 is not electrically connected to the anode 221. The cathode layer 236 may be located in the same layer and made of the same material as the cathode 223 of the organic light emitting device 22, and the cathode layer 236 in the non-display area NA and the cathode 223 in the display area AA may be formed as the same film layer, that is, the cathode layer 236 located in the non-display area NA is electrically connected to the cathode 223 located in the display area AA. In this way, the conductive wire 233 is electrically connected to the cathode 223 of the organic light emitting device 22 through the conductive layer 235, and the cathode 223 of the organic light emitting device 22 may be electrically connected to the integrated circuit IC through the conductive wire 233.

In the illustrated embodiments, the display substrate further includes a trench 237 formed in the interlayer dielectric layer 232. There is one trench 237 in the embodiments. At least a part of the conductive wire 233 is formed in the trench 237. As shown, the conductive wire 233 has a zigzag structure, for example, the conductive wire 233 has a "1" shape.

As shown, for convenience of description, a direction parallel to the upper surface of the base substrate 20 is referred to as a first direction, that is, the X direction as shown in the figure. A direction perpendicular to the upper surface of the base substrate 20 is referred to as a second direction, that is, the Y direction as shown in the figure.

Specifically, the conductive wire 233 may include a first portion 233A extending in the first direction and a second portion 233B extending in the second direction. The first portion 233A is formed on a bottom of the trench 237, and the second portion 233B is formed on a sidewall of the trench 237.

In the illustrated embodiments, the conductive wire 233 includes one first portion 233A and two second portions 233B. In this way, the overall width w of the conductive wire 233 is equal to the sum of a width of the one first portion 233A in the first direction (i.e., w1 in FIG. 3) and two times of a height of the second portion 233B in the second direction (i.e., w2 in FIG. 3), that is $w = w1 + 2 \cdot w2$.

As shown in FIG. 2, an orthographic projection of the conductive wire 233 on the base substrate 20 may have an inverted U-shape. Specifically, the conductive wire 233 is located on the left, right, and upper sides of the frame of the display substrate, and is electrically connected to the electrical connection portion or integrated circuit IC located on the lower side of the frame.

Since the second portion 233B of the conductive wire 233 extends perpendicular to the upper surface of the base substrate 20 and does not occupy a width of the frame, when a conductive wire having a width of w is formed, a border width occupied by the conductive wire 14 on one side of the frame in the related art corresponding to FIG. 1A and FIG. 1B is w, a border width occupied by the conductive wire 233 on one side of the frame in the embodiments corresponding to FIGS. 2 to 4 is w', and w'<w. Therefore, the display substrate according to the embodiments of the present disclosure may realize a narrow frame. At the same time, since the overall width of the conductive wire is unchanged, the conductive wire of the display substrate according to the embodiments of the present disclosure also have a relatively small resistance value, resulting in a reduced resistance drop (IR Drop) and a good long range uniformity (LRU). In addition, in some embodiments of the present disclosure, the conductive wire 233 is in direct electrical contact with the metal layer 231, so as to form a parallel connection. The resistance value of the conductive wire is further reduced, which may further reduce the resistance drop (IR Drop) and improve the long range uniformity.

Figure 5:
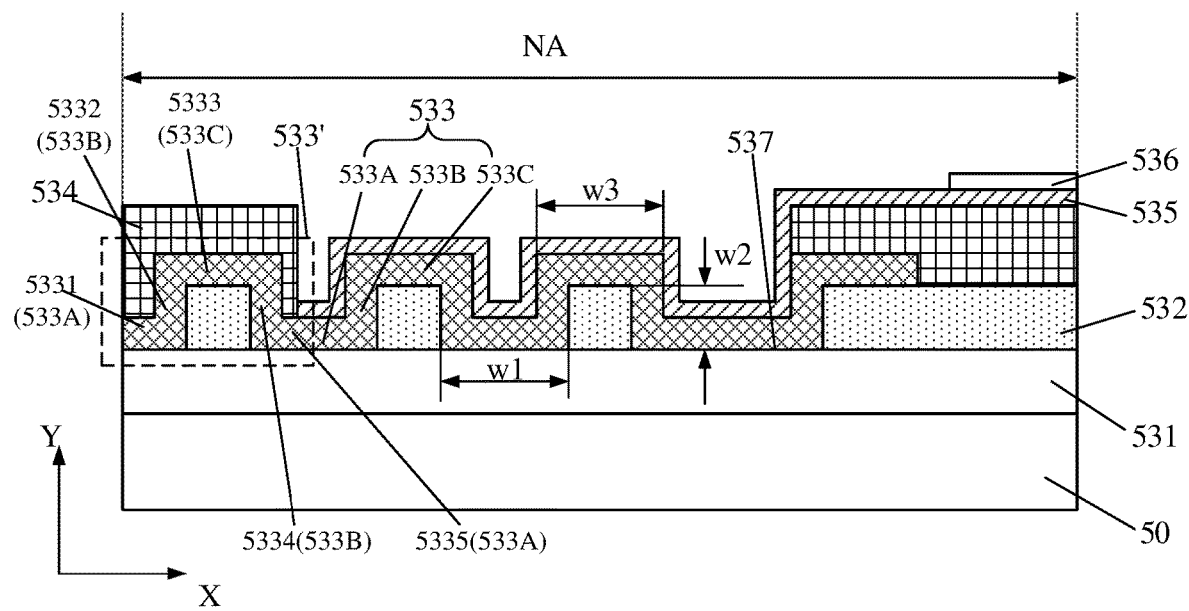
FIG. 5 is a cross-sectional view taken along a B-B' direction in FIG. 2, which shows a cross-sectional structure in a non-display area on one side of the display substrate, and specifically shows a conductive wire in a trench formed in an insulating layer.
Figure 6:
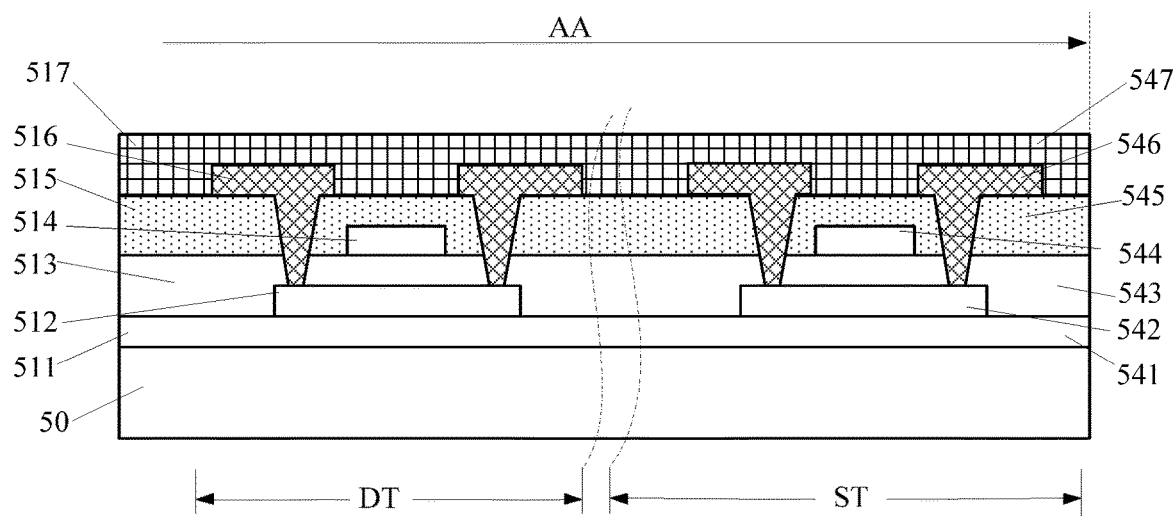
FIG. 6 is a cross-sectional view taken along a C-C' direction in FIG. 2, which illustrates a partial cross-sectional structure in a display area of the display substrate.

In some embodiments, FIG. 5 is a cross-sectional view taken along the B-B' direction in FIG. 2, which shows a cross-sectional structure of the non-display area NA of the display substrate, and FIG. 6 is a cross-sectional view taken along the C-C' direction in FIG. 2, which shows a cross-sectional structure of the display area AA of the display substrate.

Optionally, referring to FIG. 2 and FIG. 5, the display substrate may include: a metal layer 531, an interlayer dielectric layer 532, a conductive wire 533, a planarization layer 534, a conductive layer 535 and a cathode layer 536 which are disposed on a base substrate 50 and located in the non-display area NA. The metal layer 531, the interlayer dielectric layer 532, the conductive wire 533, the planarization layer 534, the conductive layer 535, and the cathode layer 536 are sequentially disposed on the base substrate 50.

Optionally, as shown in FIG. 6, the display substrate includes a driving transistor DT and a switching transistor ST. Both the driving transistor DT and the switching transistor ST may be thin film transistors. Specifically, the driving transistor DT may include: a first buffer layer 511, a first active layer 512, a first gate insulating layer 513, a first gate layer 514, a first interlayer dielectric layer 515, a first source-drain layer 516 and a first planarization layer 517 which are disposed on a base substrate 50 and located in the display area AA. The switching transistor ST may include a second buffer layer 541, a second active layer 542, a second gate insulating layer 543, a second gate layer 544, a second interlayer dielectric layer 545, a second source-drain layer 546, and a second planarization layer 547 which are disposed on the base substrate 50 and located in the display area AA.

For example, the first buffer layer 511 may be located in the same layer and made of the same material as the second buffer layer 541, that is, the first buffer layer 511 and the second buffer layer 541 are formed as the same film layer. The first interlayer dielectric layer 515 may be located in the same layer and made of the same material as the second interlayer dielectric layer 545, that is, the first interlayer dielectric layer 515 and the second interlayer dielectric layer 545 are formed as the same film layer. The first planarization layer 517 may be located in the same layer and made of the same material as the second planarization layer 547, that is, the first planarization layer 517 and the second planarization layer 547 are formed as the same film layer.

The first gate insulating layer 513 may be located in the same layer and made of the same material as the second gate insulating layer 543, that is, the first gate insulating layer 513 and the second gate insulating layer 543 are formed as the same film layer. Alternatively, the first gate insulating layer 513 and the second gate insulating layer 543 are located in different layers, and they may be formed as different film layers.

It should be understood that, in the embodiments, the display substrate further includes an organic light emitting device, a structure of which is similar to that of the organic light emitting device 22 shown in FIG. 4. Reference may be made to the above description of the organic light emitting device 22, and details are not described herein again.

With reference to FIGS. 5 and 6, the metal layer 531 may be located in the same layer and made of the same material as the second gate layer 544. It should be understood that the metal layer 531 in the non-display area NA is not electrically connected to the second gate layer 544 in the display area AA. The interlayer dielectric layer 532 may be located in the same layer and made of the same material as the interlayer dielectric layers 515, 545, that is, the interlayer dielectric layer 532 in the non-display area NA and the interlayer dielectric layers 515, 545 in the display area AA may be formed as the same film layer. The planarization layer 534 may be located in the same layer and made of the same material as the planarization layers 517, 547, that is, the planarization layer 534 in the non-display area NA and the planarization layers 517, 547 in the display area AA may be formed as the same film layer.

Optionally, the conductive wire 533 may be located in the same layer and made of the same material as the second source-drain layer 546. The conductive layer 535 may be located in the same layer and made of the same material as the anode of the organic light emitting device. It should be understood that the conductive layer is not electrically connected to the anode. The cathode layer 536 may be located in the same layer and made of the same material as the cathode of the organic light emitting device, and the cathode layer 536 located in the non-display area NA and the cathode located in the display area AA may be formed as the same film layer, that is, the cathode layer 536 in the display area NA is electrically connected to the cathode located in the display area AA.

In the illustrated embodiments, the display substrate further includes a plurality of trenches 537 formed in the interlayer dielectric layer 532. At least a part of the conductive wire 533 is formed in the trenches 537. As shown, the conductive wire 533 has a zigzag structure.

As shown, the conductive wire 533 may include a first portion 533A extending in the first direction (such as the X direction), a second portion 533B extending in the second direction (such as the Y direction), and a third portion 533C extending in the first direction. The second portion 533B is located between the first portion 533A and the third portion 533C, and connects the first portion 533A with the third portion 533C. The first portion 533A is formed on a bottom of the trench 537, the second portion 533B is formed on a sidewall of the trench 537, and the third portion 533C is formed on the interlayer dielectric layer 532.

Optionally, each trench 537 penetrates the interlayer dielectric layer 532 in the second direction, so that the first portion 533A of the conductive wire 533 is directly formed on the metal layer 531. In this way, the first portion 533A is directly formed on the metal layer 531, and the third portion 533C is directly formed on the interlayer dielectric layer 532. The first portion 533A and the third portion 533C are located at different height positions in the second direction, and the second portion 533B extending in the second direction connects the first portion 533A with the third portion 533C which is located at a different height position from the first portion 533A. It can be understood that a height difference between the first portion 533A and the third portion 533C in the second direction is substantially equal to a film thickness of the interlayer dielectric layer 532, that is, a height of the second portion 533B in the second direction is substantially equal to the film thickness of the interlayer dielectric layer 532.

As shown, it can be understood that the conductive wire 533 includes a plurality of conductive wire sub-portions 533', which is indicated by a part of the conductive wire framed by a dotted line in the figure. Each conductive wire sub-portion 533' has a

shape, and includes a first segment 5331 (i.e., a part of one first portion 533A), a second segment 5332 (i.e., one second portion 533B), a third segment 5333 (i.e., one third portion 533C), a fourth segment 5334 (i.e., another second portion 533B) and a fifth segment 5335 (i.e., a part of another first portion 533A) which are connected in sequence. The plurality of conductive wire sub-portions 533' are periodically arranged in the first direction to form the conductive wire 533.

In the embodiments, the conductive wire 533 includes a plurality of second portions extending in the second direction, which may further reduce the border width occupied by the conductive wire on one side of the frame, thereby realizing a narrow frame. Moreover, a reduced resistance voltage drop (IR Drop) and a good long-range uniformity (LRU) may be obtained. In addition, in some embodiments of the present disclosure, the conductive wire 533 is in direct electrical contact with the metal layer 531, so as to form a parallel connection. The resistance value of the conductive wire is further reduced, which may further reduce the resistance drop (IR Drop) and improve the long range uniformity (LRU).

Similarly, an orthographic projection of the conductive wire 533 on the base substrate 50 may have an inverted U-shape.

Optionally, a width w1 of the first portion 533A in the first direction may be equal to a width w3 of the third portion 533C in the first direction, and a height w2 of the second portion 533B in the second direction may be smaller than the width w1 of the first portion 533A in the first direction. For example, the film thickness of the interlayer dielectric layer 532 may be 0.5 µm, a width of each trench 537 in the first direction may be 6 µm, and an interval between two adjacent trenches 537 may be 6 µm, that is, the width w1 of the first portion 533A in the first direction may be 6 µm, the height w2 of the second portion 533B in the second direction may be 0.5 µm, and the width w3 of the third portion 533C in the first direction may be 6 µm. In this way, the width of the conductive wire 533 in the first direction may be reduced by (0.5/(6+0.5)), that is, reduced by ⅟13. That is, the border width occupied by the conductive wire 533 on one side of the frame may be reduced by ⅟13. For example, when forming a conductive wire having an overall width of 200 µm, the border width occupied by the conductive wire on one side of the frame may be reduced by about 15.4 µm.

Figure 7:
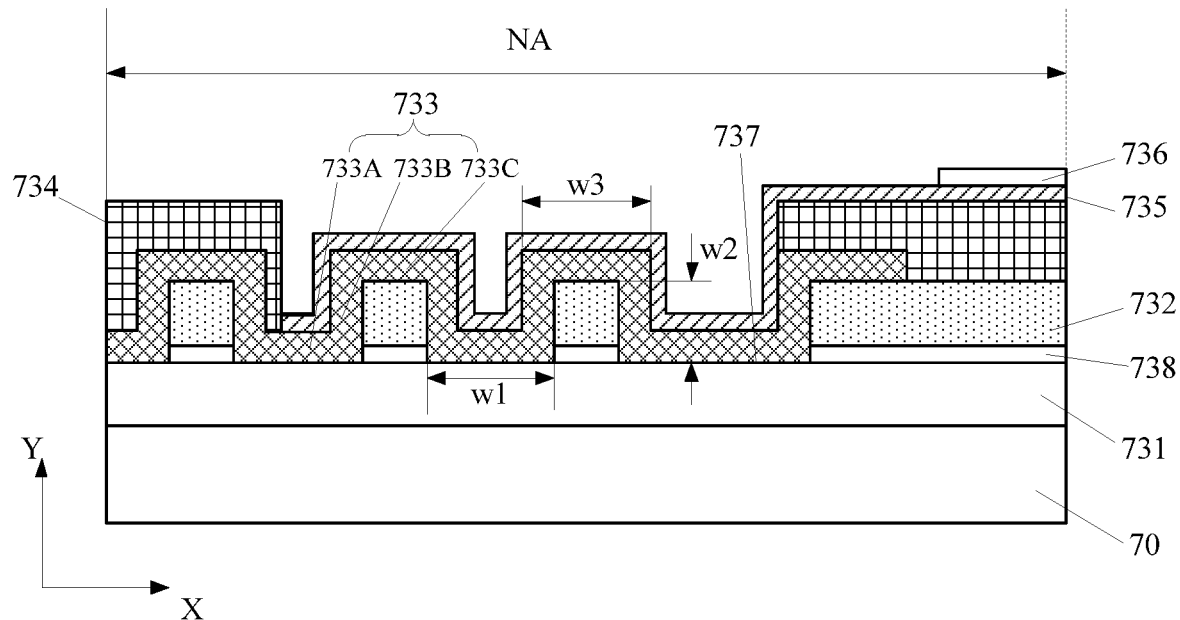
FIG. 7 is a cross-sectional view taken along a B-B' direction in FIG. 2, which shows a cross-sectional structure in a non-display area on one side of the display substrate, and specifically shows a conductive wire in a trench formed in a first gate insulating layer and an interlayer dielectric layer.

In some embodiments, FIG. 7 is a cross-sectional view taken along the B-B' direction in FIG. 2, which shows a cross-sectional structure of the non-display area NA of the display substrate.

With reference to FIG. 2 and FIG. 7, the display substrate may include: a metal layer 731, a first insulating layer 738, an interlayer dielectric layer 732, a conductive wire 733, a planarization layer 734, a conductive layer 735 and a cathode layer 736 which are disposed on a base substrate 70 and located in the non-display area NA. The metal layer 731, the first insulating layer 738, the interlayer dielectric layer 732, the conductive wire 733, the planarization layer 734, the conductive layer 735, and the cathode layer 736 are sequentially disposed on the base substrate 70.

With reference to FIGS. 6 and 7, the metal layer 731 may be located in the same layer and made of the same material as the first gate layer 514. It should be understood that the metal layer 731 in the non-display area NA is not electrically connected to the first gate layer 514 in the display area AA. The first insulating layer 738 may be located in the same layer and made of the same material as the first gate insulating layer 513, that is, the first insulating layer 738 in the non-display area NA and the first gate insulating layer 513 in the display area AA may be formed as the same film layer. The interlayer dielectric layer 732 may be located in the same layer and made of the same material as the interlayer dielectric layers 515, 545, that is, the interlayer dielectric layer 732 in the non-display area NA and the interlayer dielectric layers 515, 545 in the display area AA may be formed as the same film layer. The planarization layer 734 may be located in the same layer and made of the same material as the planarization layers 517, 547, that is, the planarization layer 734 in the non-display area NA and the planarization layers 517, 547 in the display area AA may be formed as the same film layer.

Optionally, the conductive wire 733 may be located in the same layer and made of the same material as the second source-drain layer 546. The conductive layer 735 may be located in the same layer and made of the same material as the anode of the organic light emitting device. It should be understood that the conductive layer is not electrically connected to the anode. The cathode layer 736 may be located in the same layer and made of the same material as the cathode of the organic light emitting device, and the cathode layer 736 located in the non-display area NA and the cathode located in the display area AA may be formed as the same film layer, that is, the cathode layer 736 located in the non-display area NA is electrically connected to the cathode located in the display area AA.

In the illustrated embodiments, the display substrate further includes a plurality of trenches 737 formed in the first insulating layer 738 and the interlayer dielectric layer 732. For example, each trench 737 penetrates both the first insulating layer 738 and the interlayer dielectric layer 732 in the second direction.

At least a part of the conductive wire 733 is formed in the trenches 737 so that the conductive wire 733 may have a zigzag structure. As shown, the conductive wire 733 may include a first portion 733A extending in the first direction, a second portion 733B extending in the second direction, and a third portion 733C extending in the first direction. The second portion 733B is located between the first portion 733A and the third portion 733C, and connects the first portion 733A with the third portion 733C. The first portion 733A is formed on a bottom of the trench 737, the second portion 733B is formed on a sidewall of the trench 737, and the third portion 733C is formed on the interlayer dielectric layer 732.

Optionally, the first portion 733A of the conductive wire 733 is directly formed on the metal layer 731. In this way, the first portion 733A is directly formed on the metal layer 731, and the third portion 733C is directly formed on the interlayer dielectric layer 732. The first portion 733A and the third portion 733C are located at different height positions in the second direction, and the second portion 733B extending in the second direction connects the first portion 733A with the third portion 733C which is located at a different height position from the first portion 733A.

In the embodiments, the conductive wire 733 includes a plurality of second portions 733B extending in the second direction. Since each trench 737 penetrates both the first insulating layer 738 and the interlayer dielectric layer 732, a height of the second portion 733B in the second direction is substantially equal to a sum of film thicknesses of the metal layer 731 and the interlayer dielectric layer 732. In this way, the border width occupied by the conductive wire on one side of the frame may be further reduced, which is more conducive to achieving a narrow frame. Moreover, a reduced resistance voltage drop (IR Drop) and a good long-range uniformity (LRU) may be obtained. In addition, in some embodiments of the present disclosure, the conductive wire 733 is in direct electrical contact with the metal layer 731, so as to form a parallel connection. The resistance value of the conductive wire is further reduced, which may further reduce the resistance drop (IR Drop) and improve the long range uniformity (LRU).

Optionally, a width w1 of the first portion 733A in the first direction may be equal to a width w3 of the third portion 733C in the first direction, and a height w2 of the second portion 733B in the second direction may be smaller than the width w1 of the first portion 733A in the first direction. For example, the film thickness of the first insulating layer 738 may be 0.1 μm, the film thickness of the interlayer dielectric layer 732 may be 0.5 μm, a width of each trench 737 in the first direction may be 6 μm, and an interval between two adjacent trenches 737 may be 6 μm, that is, the width w1 of the first portion 733A in the first direction may be 6 μm, the height w2 of the second portion 733B in the second direction may be 0.6 μm, and the width w3 of the third portion 733C in the first direction may be 6 μm. In this way, the width of the conductive wire 733 in the first direction may be reduced by (0.6/(6+0.6)), that is, reduced by ¹⁄₁₁. That is, the border width occupied by the conductive wire 733 on one side of the frame may be reduced by ¹⁄₁₁. For example, when forming a conductive wire having an overall width of 200 μm, the border width occupied by the conductive wire on one side of the frame may be reduced by about 18.2 μm.

Similarly, an orthographic projection of the conductive wire 733 on the base substrate 70 may have an inverted U-shape, and the conductive wire 733 also includes a plurality of conductive wire sub-portions arranged in a periodic manner, which can be referred to the above description, and will not be repeated here.

Figure 8:
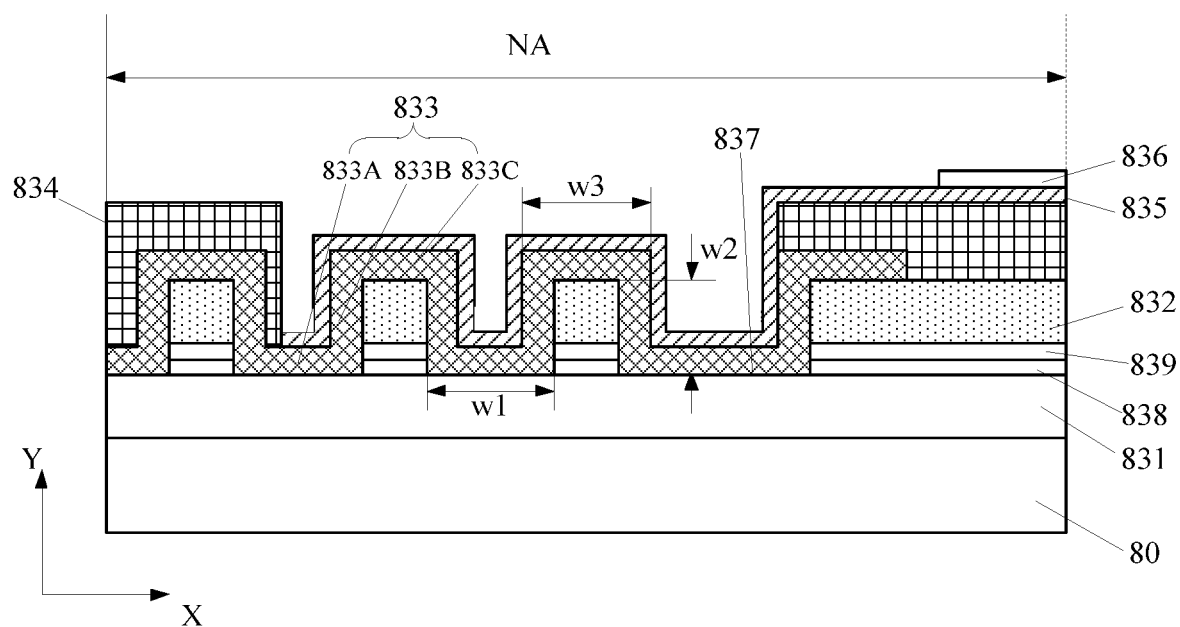
FIG. 8 is a cross-sectional view taken along a B-B' direction in FIG. 2, which shows a cross-sectional structure in a non-display area on one side of the display substrate, and specifically shows a conductive wire in a trench formed in a first gate insulating layer, a second gate insulating layer and an interlayer dielectric layer.

In some embodiments, FIG. 8 is a cross-sectional view taken along the B-B' direction in FIG. 2, which shows a cross-sectional structure of the non-display area NA of the display substrate.

With reference to FIG. 2 and FIG. 8, the display substrate may include: a polysilicon layer 831, a first insulating layer 838, a second insulating layer 839, an interlayer dielectric layer 832, a conductive wire 833, a planarization layer 834, a conductive layer 835, and a cathode layer 836 which are disposed on a base substrate 80 and located in the non-display area NA. The polysilicon layer 831, the first insulating layer 838, the second insulating layer 839, the interlayer dielectric layer 832, the conductive wire 833, the planarization layer 834, the conductive layer 835, and the cathode layer 836 are sequentially disposed on the base substrate 80.

With reference to FIG. 6 and FIG. 8, the polysilicon layer 831 may be located in the same layer and made of the same material as the first active layer 512, that is, the polysilicon layer 831 located in the non-display area NA and the active layer 512 located in the display area AA may be formed as the same film layer. The first insulating layer 838 may be located in the same layer and made of the same material as the first gate insulating layer 513, that is, the first insulating layer 838 in the non-display area NA and the first gate insulating layer 513 in the display area AA may be formed as the same film layer. The second insulating layer 839 may be located in the same layer and made of the same material as the second gate insulating layer 543, that is, the second insulating layer 839 in the non-display area NA and the second gate insulating layer 543 in the display area AA may be formed as the same film layer. The interlayer dielectric layer 832 may be located in the same layer and made of the same material as the interlayer dielectric layers 515, 545, that is, the interlayer dielectric layer 832 located in the non-display area NA and the interlayer dielectric layers 515, 545 located in the display area AA may be formed as the same film layer. The planarization layer 834 may be located in the same layer and made of the same material as the planarization layers 517, 547, that is, the planarization layer 834 in the non-display area NA and the planarization layers 517, 547 in the display area AA may be formed as the same film layer.

Optionally, the conductive wire 833 may be located in the same layer and made of the same material as the second source-drain layer 546. The conductive layer 835 may be located in the same layer and made of the same material as the anode of the organic light emitting device. It should be understood that the conductive layer is not electrically connected to the anode. The cathode layer 836 may be located in the same layer and made of the same material as the cathode of the organic light emitting device, and the cathode layer 836 located in the non-display area NA and the cathode located in the display area AA may be formed as the same film layer, that is, the cathode layer 836 located in the non-display area NA is electrically connected to the cathode located in the display area AA.

In the illustrated embodiments, the display substrate further includes a plurality of trenches 837 formed in the first insulating layer 838, the second insulating layer 839, and the interlayer dielectric layer 832. For example, each trench 837 penetrates the first insulating layer 838, the second insulating layer 839, and the interlayer dielectric layer 832 in the second direction.

At least a part of the conductive wire 833 is formed in the trenches 837 so that the conductive wire 833 may have a zigzag structure. As shown, the conductive wire 833 may include a first portion 833A extending in the first direction, a second portion 833B extending in the second direction, and a third portion 833C extending in the first direction. The second portion 833B is located between the first portion 833A and the third portion 833C, and connects the first portion 833A with the third portion 833C. The first portion 833A is formed on a bottom of the trench 837, the second portion 833B is formed on a sidewall of the trench 837, and the third portion 833C is formed on the interlayer dielectric layer 832.

Optionally, the first portion 833A of the conductive wire 833 is directly formed on the polysilicon layer 831. In this way, the first portion 833A is directly formed on the polysilicon layer 831, and the third portion 833C is directly formed on the interlayer dielectric layer 832. The first portion 833A and the third portion 833C are located at different height positions in the second direction, and the second portion 833B extending in the second direction connects the first portion 833A with the third portion 833C which is located at a different height position from the first portion 833A.

In the embodiments, the conductive wire 833 includes a plurality of second portions 833B extending in the second direction. Since each trench 837 penetrates the first insulating layer 838, the second insulating layer 839 and the interlayer dielectric layer 832, a height of the second portion 833B in the second direction is substantially equal to a sum of film thicknesses of the first insulating layer 838, the second insulating layer 839, and the interlayer dielectric layer 832. In this way, the border width occupied by the conductive wire on one side of the frame may be further reduced, which is more conducive to achieving a narrow frame. Meanwhile, a reduced resistance voltage drop (IR Drop) and a good long-range uniformity (LRU) may be obtained.

Optionally, a width w1 of the first portion 833A in the first direction may be equal to a width w3 of the third portion 833C in the first direction, and a height w2 of the second portion 833B in the second direction may be smaller than the width w1 of the first portion 833A in the first direction. For example, the film thickness of the first insulating layer 838 may be 0.1 μm, the film thickness of the second insulating layer 838 may be 0.1 μm, and the film thickness of the interlayer dielectric layer 832 may be 0.5 μm, a width of each trench 737 in the first direction may be 6 μm, and an interval between two adjacent trenches 737 may be 6 μm, that is, the width w1 of the first portion 833A in the first direction may be 6 μm, the height w2 of the second portion 833A in the second direction may be 0.7 μm, and the width w3 of the third portion 833C in the first direction may be 6 μm. In this way, the width of the conductive wire 833 in the first direction may be reduced by (0.7/(6+0.7)), that is, reduced by 1/10. That is, the border width occupied by the conductive wire 833 on one side of the frame can be reduced by 1/10. For example, when forming a conductive wire having an overall width of 200 μm, the border width occupied by the conductive wire on one side of the frame can be reduced by about 20 μm.

Similarly, an orthographic projection of the conductive wire 833 on the base substrate 80 may have an inverted U-shape, and the conductive wire 833 also includes a plurality of conductive wire sub-portions arranged in a periodic manner, which can be referred to the above description and will not be repeated here.

Figure 9:
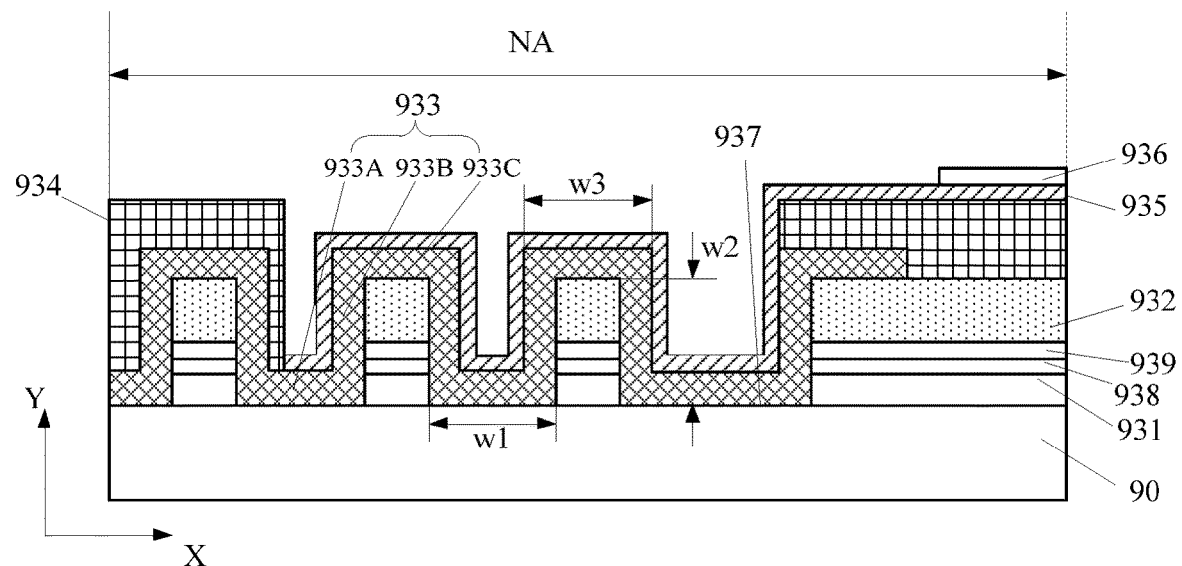
FIG. 9 is a cross-sectional view taken along a B-B' direction in FIG. 2, which shows a cross-sectional structure in a non-display area on one side of the display substrate, and specifically shows a conductive wire in a trench formed in a buffer layer, a first gate insulating layer, a second gate insulating layer and an interlayer dielectric layer.

In some embodiments, FIG. 9 is a cross-sectional view taken along the B-B' direction in FIG. 2, which shows a cross-sectional structure of the non-display area NA of the display substrate.

With reference to FIG. 2 and FIG. 9, the display substrate may include: a buffer layer 931, a first insulating layer 938, a second insulating layer 939, an interlayer dielectric layer 932, a conductive wire 933, a planarization layer 934, a conductive layer 935, and a cathode layer 936 which are disposed on a base substrate 90 and located in the non-display area NA. The buffer layer 931, the first insulating layer 938, the second insulating layer 939, the interlayer dielectric layer 932, the conductive wire 933, the planarization layer 934, the conductive layer 935, and the cathode layer 936 are sequentially disposed on the base substrate 90.

With reference to FIG. 6 and FIG. 9, the buffer layer 931 may be located in the same layer and made of the same material as the first buffer layer 511, that is, the buffer layer 931 in the non-display area NA and the first buffer layer 511 in the display area AA may be formed as the same film layer. The first insulating layer 938 may be located in the same layer and made of the same material as the first gate insulating layer 513, that is, the first insulating layer 938 in the non-display area NA and the first gate insulating layer 513 in the display area AA may be formed as the same film layer. The second insulating layer 939 may be located in the same layer and made of the same material as the second gate insulating layer 543, that is, the second insulating layer 939 in the non-display area NA and the second gate insulating layer 543 in the display area AA may be formed as the same film layer. The interlayer dielectric layer 932 may be located in the same layer and made of the same material as the interlayer dielectric layers 515, 545, that is, the interlayer dielectric layer 932 located in the non-display area NA and the interlayer dielectric layers 515, 545 located in the display area AA may be formed as the same film layer. The planarization layer 934 may be located in the same layer and made of the same material as the planarization layers 517, 547, that is, the planarization layer 934 in the non-display area NA and the planarization layers 517, 547 in the display area AA may be formed as the same film layer.

Optionally, the conductive wire 933 may be located in the same layer and made of the same material as the second source-drain layer 546. The conductive layer 935 may be located in the same layer and made of the same material as the anode of the organic light emitting device. It should be understood that the conductive layer is not electrically connected to the anode. The cathode layer 936 may be located in the same layer and made of the same material as the cathode of the organic light emitting device, and the cathode layer 936 located in the non-display area NA and the cathode located in the display area AA may be formed as the same film layer, that is, the cathode layer 936 located in the display area NA is electrically connected to the cathode located in the display area AA.

In the illustrated embodiments, the display substrate further includes a plurality of trenches 937 formed in the buffer layer 931, the first insulating layer 938, the second insulating layer 939, and the interlayer dielectric layer 932. For example, each trench 937 penetrates the buffer layer 931, the first insulating layer 938, the second insulating layer 939 and the interlayer dielectric layer 932 in the second direction.

At least a part of the conductive wire 933 is formed in the trenches 937 so that the conductive wire 933 may have a zigzag structure. As shown, the conductive wire 933 may include a first portion 933A extending in the first direction, a second portion 933B extending in the second direction, and a third portion 933C extending in the first direction. The second portion 933B is located between the first portion 933A and the third portion 933C, and connects the first portion 933A with the third portion 933C. The first portion 933A is formed on a bottom of the trench 937, the second portion 933B is formed on a sidewall of the trench 937, and the third portion 933C is formed on the interlayer dielectric layer 932.

Optionally, the first portion 933A of the conductive wire 933 is formed directly on the base substrate 90. In this way, the first portion 933A is directly formed on the base substrate 90, and the third portion 933C is directly formed on the interlayer dielectric layer 932. The first portion 933A and the third portion 933C are located at different height positions in the second direction, and the second portion 933B extending in the second direction connects the first portion 933A with the third portion 933C which is located at a different height position from the first portion 933A.

In the embodiments, the conductive wire 933 includes a plurality of second portions 933B extending in the second direction. Since each trench 937 penetrates the buffer layer 931, the first insulating layer 938, the second insulating layer 939, and the interlayer dielectric layer 932, a height of the second portion 933B in the second direction is substantially equal to a sum of film thicknesses of the buffer layer 931, the first insulating layer 938, the second insulating layer 939, and the interlayer dielectric layer 932. In this way, the border width occupied by the conductive wire on one side of the frame may be further reduced, which is more conducive to achieving a narrow frame. Meanwhile, a reduced resistance voltage drop (IR Drop) and a good long-range uniformity (LRU) may be obtained.

Optionally, a width w1 of the first portion 933A in the first direction may be equal to a width w3 of the third portion 933C in the first direction, and a height w2 of the second portion 933B in the second direction may be smaller than the width w1 of the first portion 933A in the first direction. For example, the film thickness of the buffer layer 931 may be 0.4 μm, the film thickness of the first insulating layer 938 may be 0.1 μm, the film thickness of the second insulating layer 938 may be 0.1 μm, and the film thickness of the interlayer dielectric layer 932 may be 0.5 μm, a width of each trench 937 in the first direction may be 6 μm, and an interval between two adjacent trenches 937 may be 6 μm, that is, the width w1 of the first portion 933A in the first direction may be 6 μm, the height w2 of the second portion 933B in the second direction may be 1.1 μm, and the width w3 of the third portion 933C in the first direction may be 6 μm. In this way, the width of the conductive wire 933 in the first direction may be reduced by (1.1/(6+1.1)), that is, reduced by ⅙. That is, the border width occupied by the conductive wire 933 on one side of the frame may be reduced by ⅙. For example, when forming a conductive wire having an overall width of 200 μm, the border width occupied by the conductive wire on one side of the frame may be reduced by about 33 μm.

Similarly, an orthographic projection of the conductive wire 933 on the base substrate 90 may have an inverted U-shape, and the conductive wire 933 also includes a plurality of conductive wire sub-portions arranged in a periodic manner, which can be referred to the above description and will not be repeated here.

Figure 10:
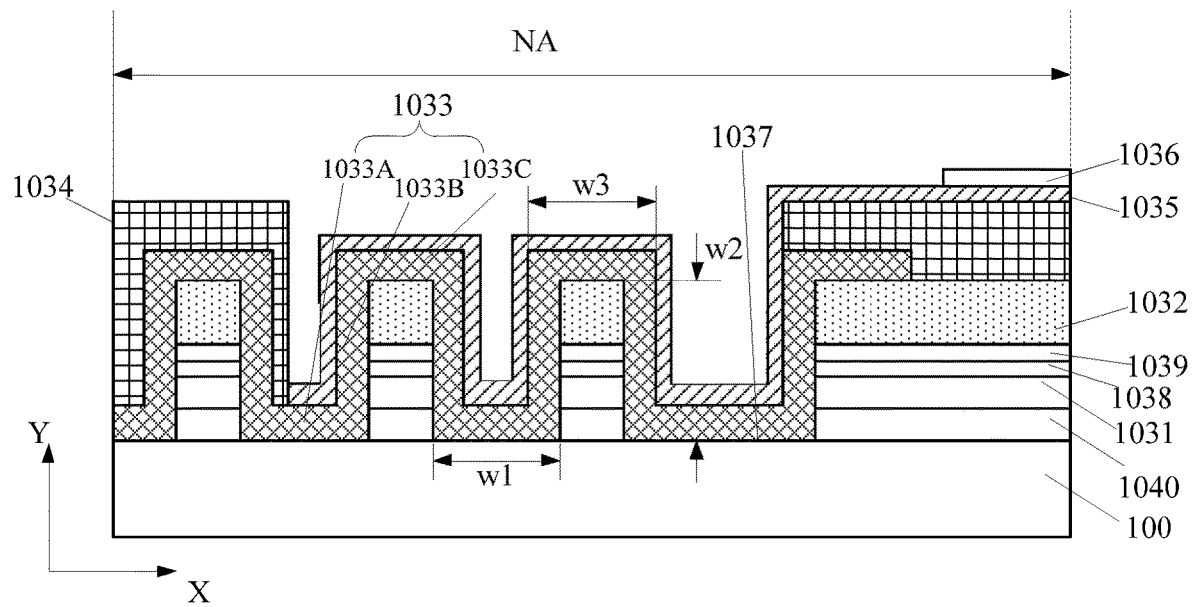
FIG. 10 is a cross-sectional view taken along a B-B' direction in FIG. 2, which shows a cross-sectional structure in a non-display area located on one side of the display substrate, and specifically illustrates a conductive wire in a trench formed in a barrier layer, a buffer layer, and a first gate insulating layer, a second gate insulating layer, and an interlayer dielectric layer.

In some embodiments, FIG. 10 is a cross-sectional view taken along the B-B' direction in FIG. 2, which shows a cross-sectional structure of the non-display area NA of the display substrate.

With reference to FIG. 2 and FIG. 10, the display substrate may include a barrier layer 1040, a buffer layer 1031, a first insulating layer 1038, a second insulating layer 1039, an interlayer dielectric layer 1032, a conductive wire 1033, a planarization layer 1034, a conductive layer 1035, and a cathode layer 1036 which are disposed on a base substrate 100 and located in the non-display area NA. The barrier layer 1040, the buffer layer 1031, the first insulating layer 1038, the second insulating layer 1039, the interlayer dielectric layer 1032, the conductive wire 1033, the planarization layer 1034, the conductive layer 1035, and the cathode layer 1036 are sequentially disposed on the base substrate 100.

It should be understood that, correspondingly, in the display area AA of the display substrate, a barrier layer is also provided on the base substrate 100. Referring back to FIG. 6, for example, a barrier layer is provided between the base substrate 50 and the first buffer layer 511. The barrier layer 1040 located in the non-display area NA and the barrier layer located in the display area AA may be formed as the same film layer. The structures of other film layers such as the buffer layer 1031, the first insulating layer 1038, the second insulating layer 1039, the interlayer dielectric layer 1032, the conductive wire 1033, the planarization layer 1034, the conductive layer 1035, and the cathode layer 1036 may be referred to the above description of FIG. 9, which will not be repeated here.

In the illustrated embodiments, the display substrate further includes a plurality of trenches 1037 formed in the barrier layer 1040, the buffer layer 1031, the first insulating layer 1038, the second insulating layer 1039, and the interlayer dielectric layer 1032. For example, each trench 1037 penetrates the barrier layer 1040, the buffer layer 1031, the first insulating layer 1038, the second insulating layer 1039, and the interlayer dielectric layer 1032 in the second direction.

At least a part of the conductive wire 1033 is formed in the trenches 1037, so that the conductive wire 1033 may have a zigzag structure. As shown, the conductive wire 1033 may include a first portion 1033A extending in the first direction, a second portion 1033B extending in the second direction, and a third portion 1033C extending in the first direction. The second portion 1033B is located between the first portion 1033A and the third portion 1033C, and connects the first portion 1033A with the third portion 1033C. The first portion 1033A is formed on a bottom of the trench 1037, the second portion 1033B is formed on a sidewall of the trench 1037, and the third portion 1033C is formed on the interlayer dielectric layer 1032.

Optionally, the first portion 1033A of the conductive wire 1033 is directly formed on the base substrate 100. In this way, the first portion 1033A is directly formed on the base substrate 100, and the third portion 1033C is directly formed on the interlayer dielectric layer 1032. The first portion 1033A and the third portion 1033C are located at different height positions in the second direction, and the second portion 1033B extending in the second direction connects the first portion 1033A with the third portion 1033C which is located at a different height position from the first portion 1033A.

In the embodiments, the conductive wire 1033 includes a plurality of second portions 1033B extending in the second direction. Since each trench 1037 penetrates the barrier layer 1040, the buffer layer 1031, the first insulating layer 1038, the second insulating layer 1039, and the interlayer dielectric layer 1032, a height of the second portion 1033B in the second direction is substantially equal to a sum of film thicknesses of the barrier layer 1040, the buffer layer 1031, the first insulating layer 1038, the second insulating layer 1039, and the interlayer dielectric layer 1032. In this way, the border width occupied by the conductive wire on one side of the frame may be further reduced, which is more conducive to achieving a narrow frame. Meanwhile, a reduced resistance voltage drop (IR Drop) and a good long-range uniformity (LRU) may be obtained Optionally, a width w1 of the first portion 1033A in the first direction may be equal to a width w3 of the third portion 1033C in the first direction, and a height w2 of the second portion 1033B in the second direction may be smaller than the width w1 of the first portion 1033A in the first direction. For example, the film thickness of the barrier layer 1040 may be 0.4 μm, the film thickness of the buffer layer 1031 may be 0.4 μm, the film thickness of the first insulating layer 1038 may be 0.1 μm, and the film thickness of the second insulating layer 1038 may be 0.1 μm, the film thickness of the interlayer dielectric layer 1032 may be 0.5 μm, a width of each trench 1037 in the first direction may be 6 μm, and an interval between two adjacent trenches 1037 may be 6 μm, that is, the width w1 the first portion 1033A in the first direction may be 6 μm, the height w2 of the second portion 1033B in the second direction may be 1.5 μm, and the width w3 of the third portion 1033C in the first direction may be 6 μm. In this way, the width of the conductive wire 1033 in the first direction may be reduced by (1.5/(6+1.5)), that is, reduced by ⅕. That is, the border width occupied by the conductive wire 1033 on one side of the frame may be reduced by ⅕. For example, when forming a conductive wire having an overall width of 200 μm, the border width occupied by the conductive wire on one side of the frame may be reduced by about 40 μm.

Similarly, an orthographic projection of the conductive wire 1033 on the base substrate 100 may have an inverted U-shape, and the conductive wire 1033 also includes a plurality of conductive wire sub-portions arranged in a periodic manner, which can be referred to the above description and will not be repeated here.

Figure 11:
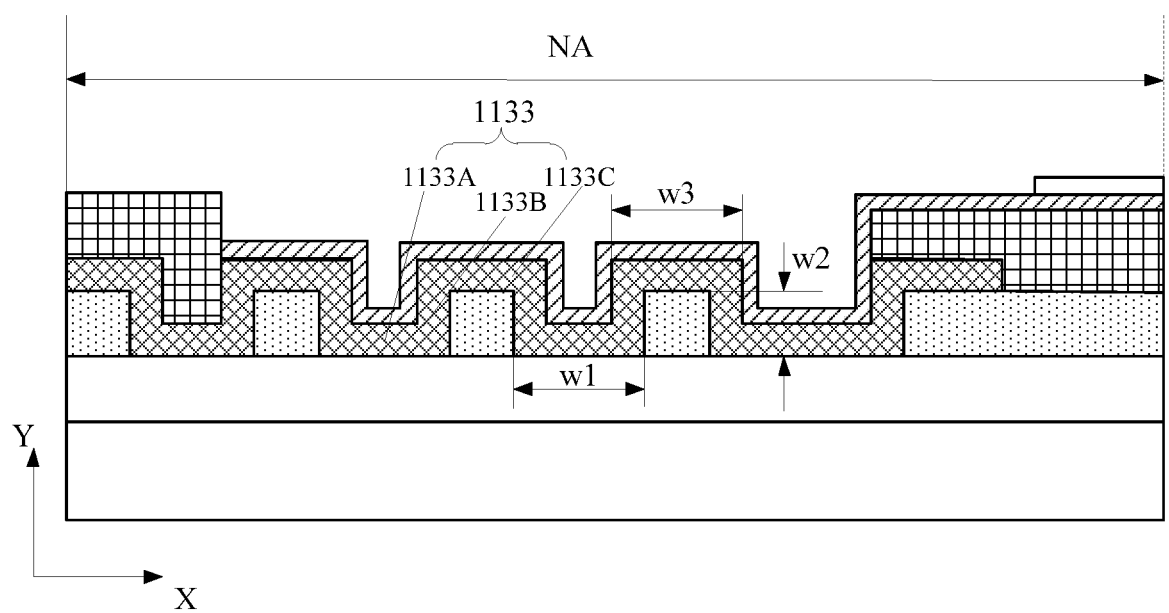
FIG. 11 is a cross-sectional view taken along a B-B' direction in FIG. 2, which shows a cross-sectional structure in a non-display area located on one side of the display substrate.

In some embodiments, FIG. 11 is a cross-sectional view taken along the B-B' direction in FIG. 2, which shows a cross-sectional structure of the non-display area NA of the display substrate. The structure of the display substrate in the non-display area NA shown in FIG. 11 is similar to that of the display substrate in the non-display area NA shown in FIG. 5. Differences between the two structures are mainly explained hereinafter.

In the embodiments shown in FIG. 11, the conductive wire 1133 may include a first portion 1133A extending in the first direction, a second portion 1133B extending in the second direction, and a third portion 1133C extending in the first direction. The second portion 1133B is located between the first portion 1133A and the third portion 1133C, and connects the first portion 1133A with the third portion 1133C. The first portion 1133A is formed on the bottom of the trench, the second portion 1133B is formed on the sidewall of the trench, and the third portion 1133C is formed on the interlayer dielectric layer.

A width w1 of the first portion 1133A in the first direction may be equal to a width w3 of the third portion 1133C in the first direction, and a height w2 of the second portion 1133B in the second direction may be smaller than the width w1 of the first portion 1133A in the first direction.

Optionally, a width of an orthographic projection of the conductive wire 1133, which is on one side of the frame, on the base substrate in the first direction (i.e., the sum of the widths w1 of the first portions 1133A in the first direction and the widths w3 of the third portions 1133C in the first direction) may be at least equal to a width of an orthographic projection of the conductive wire 14 on the base substrate in the first direction in the embodiments shown in FIG. 1B. That is, the two conductive wires occupy the same border width. For example, the width of the orthographic projection of the conductive wire 1133, which is on one side of the frame, on the base substrate in the first direction is 200 μm or more. In this case, since the overall width of the conductive wire 1133 is equal to the sum of the widths w1 of the first portions 1133A in the first direction, the heights w2 of the second portions 1133B in the second direction and the widths w3 of the third portions 1133C in the first direction, the overall width of the conductive wire 1133 is larger than the overall width of the conductive wire 14. Therefore, the conductive wire 1133 has a smaller resistance value. In this way, when the size of the frame is unchanged, by forming a conductive wire having a zigzag shape, the resistance value of the conductive wire may be reduced, thereby reducing the resistance voltage drop and further improving the long range uniformity.

In the above embodiments, the embodiments of the present disclosure have been described by taking the OLED display substrate as an example of the display substrate. However, the display substrate according to the embodiments of the present disclosure may also be other types of display substrates. For example, the display substrate may be an LCD substrate. In this case, the above-mentioned conductive wires may be a common electrode conductive wire, for example, the conductive wires 533, 733, 833, 933, 1033 and 1133 may be common electrode conductive wires, which are used to electrically connect a common electrode of the LCD substrate with an integrated circuit IC, and the common electrode may be located in a display area of the LCD substrate. The specific structure of the common electrode conductive wire may be similar to the structures described above and is not repeated here.

Hereinafter, for example, in order to form the display substrate shown in FIG. 5, a method of manufacturing a display substrate according to some embodiments of the present disclosure will be described with reference to FIGS. 12A-12F and FIG. 13.

Figure 12A:
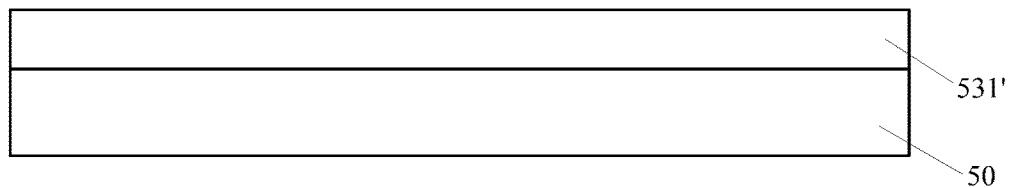
FIGS. 12A-12I schematically shows cross-sectional structures of a display substrate formed after each step of a method of manufacturing the display substrate according to some embodiments of the present disclosure is performed.

In step S130, a base substrate 50 is provided, and a metal material layer 531' is formed on the base substrate 50, as shown in FIG. 12A. For example, the metal material layer 531' is formed in both a display area AA and a non-display area NA of the base substrate 50, and a part of the metal material layer 531' in the non-display area NA constitutes a metal layer 531.

Figure 12B:
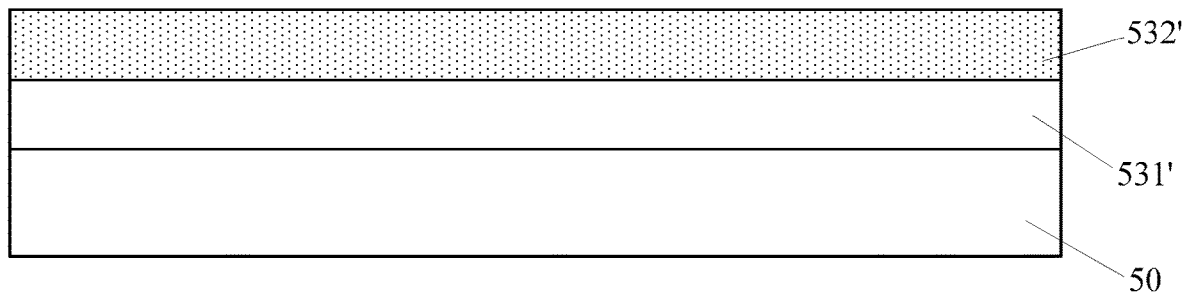

In step S131, an interlayer insulating material layer 532' is formed on the metal material layer 531', as shown in FIG. 12B. For example, the interlayer insulating material layer 532' is formed in both the display area AA and the non-display area NA of the base substrate 50, and a part of the interlayer insulating material layer 532' in the non-display area NA constitutes an interlayer dielectric layer 532.

Figure 12C:
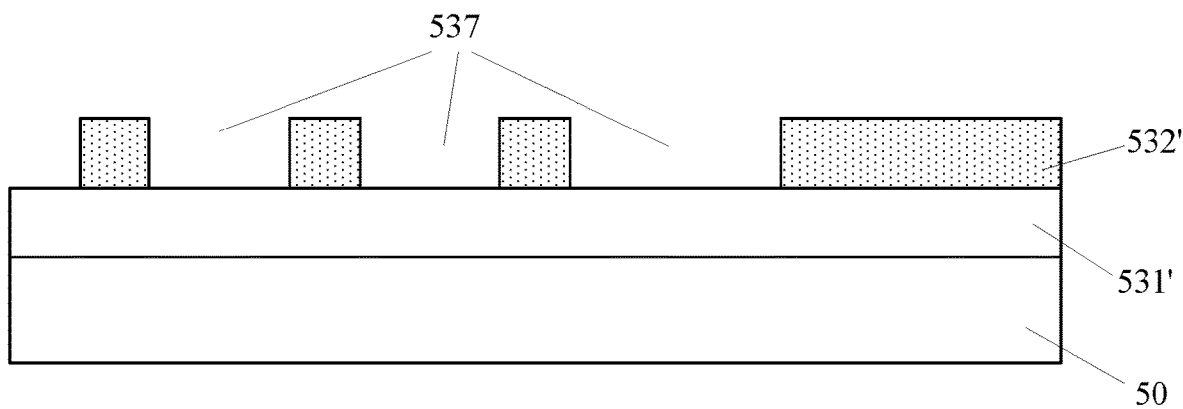

In step S132, a plurality of trenches 537 are formed in the interlayer insulating material layer 532'. For example, the plurality of trenches 537 may be formed in the interlayer insulating material layer 532' located in the non-display area NA through a patterning process, as shown in FIG. 12C.

Figure 12D:
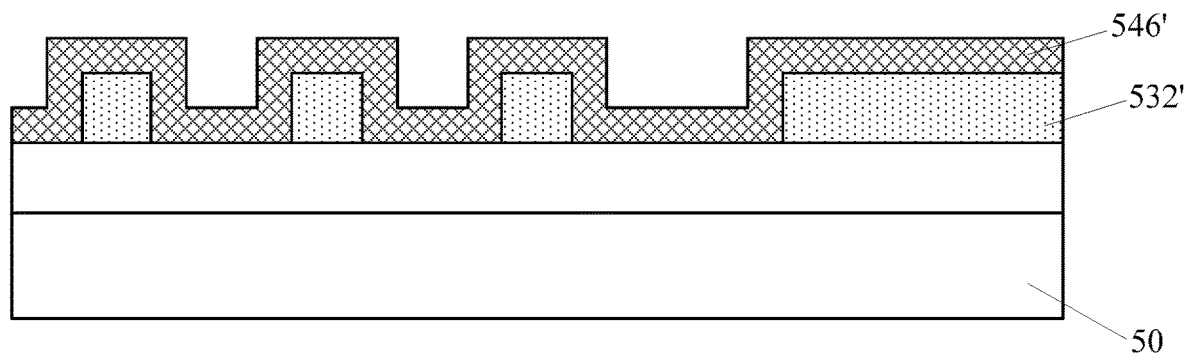

In step S133, a source-drain material layer 546' is formed on the interlayer insulating material layer 532' and in the trenches 537, as shown in FIG. 12D. For example, the source-drain material layer 546' is formed on the interlayer insulating material layer 532' and in the trenches 537 by a process such as deposition. The source-drain material layer 546' is formed in both the display area AA and the non-display area NA.

Figure 12E:
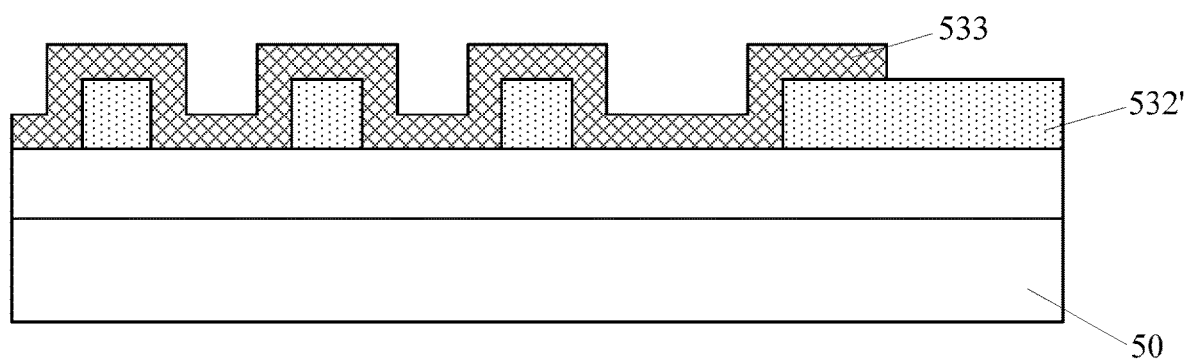

In step S134, a patterning process is performed on the source-drain material layer 546' so that a part of the source-drain material layer 546' located in the non-display area NA is formed as a conductive wire 533, as shown in FIG. 12E. For example, by performing one patterning process on the source-drain material layer 546', the part of the source-drain material layer 546' located in the non-display area NA is formed as the conductive wire 533 (see FIG. 12E and FIG. 5), and a part of the source-drain material layer 546' in the display area AA is formed as a second source-drain layer 546 (see FIG. 6).

Figure 12F:
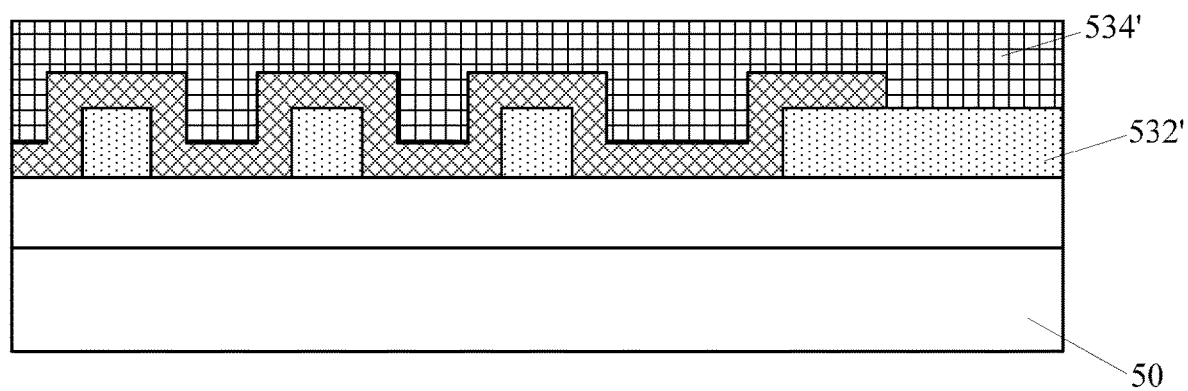

In step S135, a planarization material layer 534' is formed on the conductive wire 533, the interlayer insulating material layer 532', and the second source-drain layer 546, as shown in FIG. 12F.

Figure 12G:
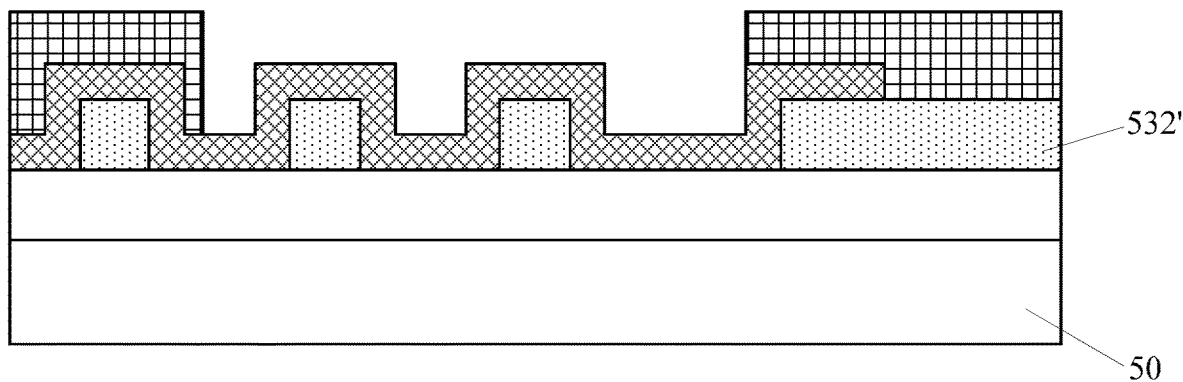

In step S136, a patterning process is performed on the planarization material layer 534' to remove a part of the planarization material layer 534' over the conductive wire 533, as shown in FIG. 12G.

Figure 12H:
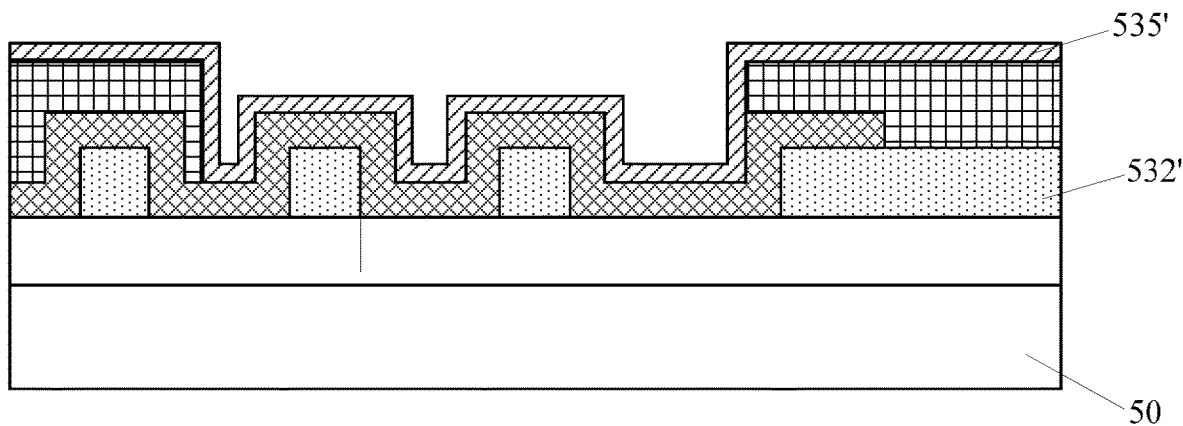

In step S137, an anode material layer 535' is formed on a part, on which the planarization material layer has been removed, of the conductive wire 533 and on the planarization material layer, as shown in FIG. 12H.

Figure 12I:
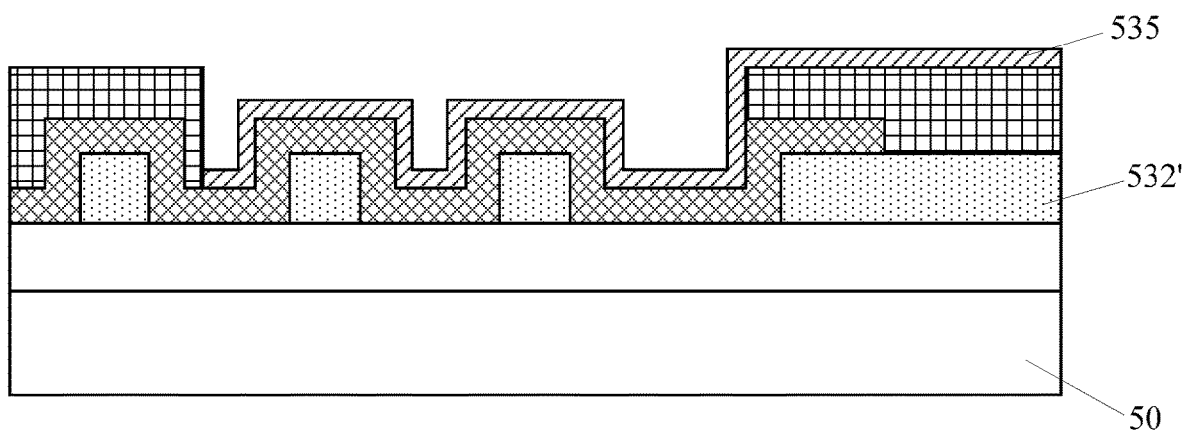
Figure 13:
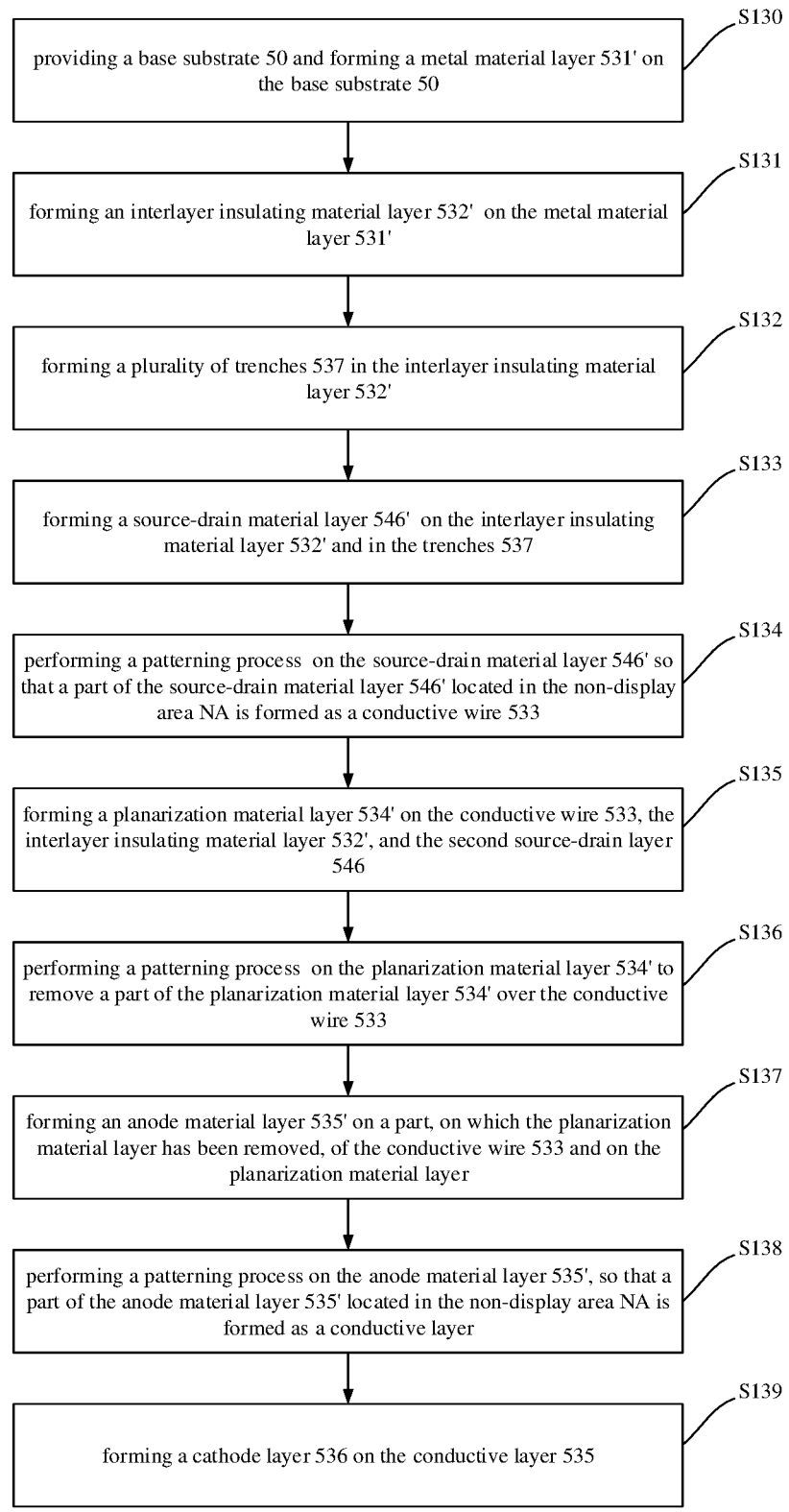
FIG. 13 is a flowchart of a method of manufacturing a display substrate according to some embodiments of the present disclosure.

In step S138, a patterning process is performed on the anode material layer 535', so that a part of the anode material layer 535' located in the non-display area NA is formed as a conductive layer 535, as shown in FIG. 12I. For example, by performing one patterning process on the anode material layer 535', a part of the anode material layer 535' located in the non-display area NA is formed as a conductive layer 535 (see FIG. 12I and FIG. 5), and a part of the anode material layer 535' located in the display area AA is formed as an anode of an organic light emitting device.

In step S139, a cathode layer 536 is formed on the conductive layer 535, as shown in FIG. 5. For example, a cathode material layer may be formed in both the non-display area NA and the display area AA by a vapor deposition process, in particular, by one vapor deposition process. A patterning process may be performed on the cathode material layer, so that a part of the cathode material layer located in the non-display area NA is formed as the cathode layer 536 (see FIG. 5).

Through the above manufacturing method, a display substrate having a conductive wire as shown in FIG. 5 may be formed, so that the border width occupied by the conductive wire on one side of the frame may be reduced, which is conducive to achieving a narrow frame. Meanwhile, a reduced resistance voltage drop (IR Drop) and a good long-range uniformity (LRU) may be obtained. In addition, each layer in the multilayer structure located in the non-display area is basically formed by the same patterning process as a corresponding layer located in the display area, thus, no additional patterning process is added, which is conducive to process realization and may save manufacturing costs.

Although the above only describes the manufacturing method of the display substrate with the conductive wire shown in FIG. 5, those skilled in the art should understand that methods of manufacturing the display substrate with conductive wires shown in other drawings can refer to the manufacturing methods described above, and will not be repeated here.

Figure 14:
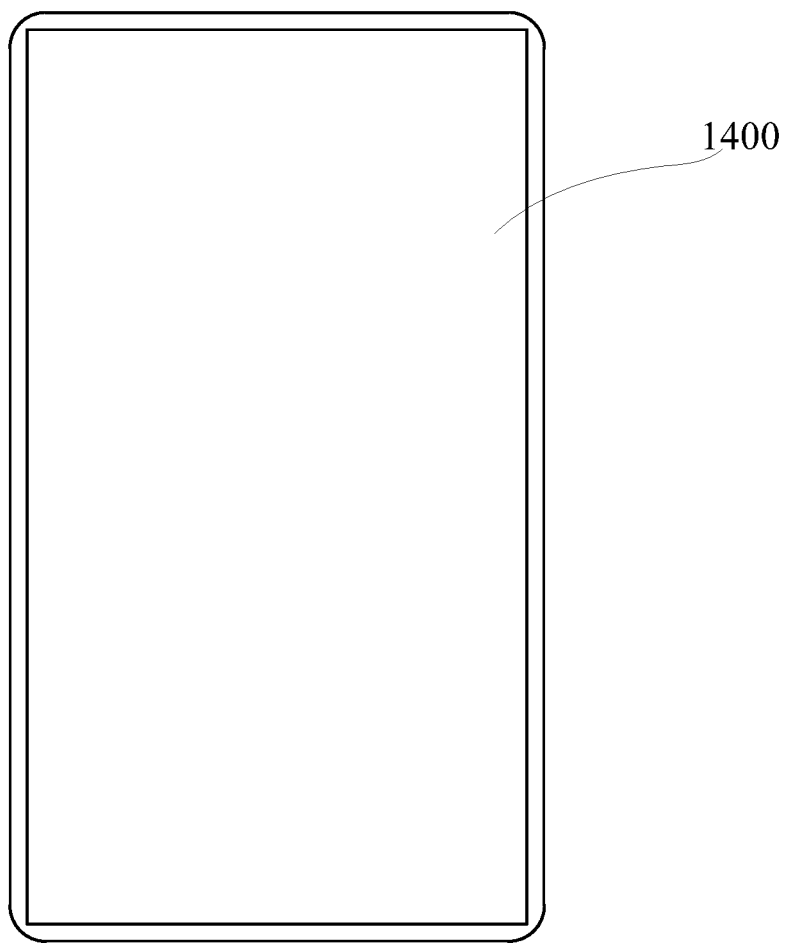
FIG. 14 is a plan view of a display device according to some embodiments of the present disclosure.

According to some embodiments of the present disclosure, there is also provided a display device, as shown in FIG. 14 which shows a plan view of a display device according to some embodiments of the present disclosure. The display device 1400 may include the display substrate described in any one of the above. For example, the display device may be any product or member with a display function, such as a smart phone, a wearable smart watch, smart glasses, a tablet computer, a television, a display, a notebook computer, a digital photo frame, a navigator, a car display, an e-book, etc. Advantageously, a display device according to some embodiments of the present disclosure may implement a narrow frame.

Although some embodiments of the general inventive concept of the present disclosure have been illustrated and described, those skilled in the art will understand that changes can be made to these embodiments without departing from the principles and spirit of the present general inventive concept. The scope of the present disclosure is defined by the claims and their equivalents.

What is claimed is:

1. A display substrate comprising:
a base substrate, comprising a display area and a peripheral area surrounding the display area;
an electroluminescent device disposed on the base substrate and located in the display area, the electroluminescent device comprising an anode, an electroluminescent layer, and a cathode disposed in this order on the base substrate;
a negative power line disposed on the base substrate and located in the peripheral area, the negative power line extending along a side of the base substrate and being electrically connected to the cathode; and
an insulating layer between the base substrate and the negative power line, a side of the insulating layer close to the negative power line being provided with at least a trench,
wherein the trench is located in the peripheral area and extends in an extending direction of the negative power line, and a part of the negative power line is located in the trench;
wherein the display substrate further comprises a thin film transistor disposed on the base substrate and located in the display area, and the thin film transistor comprises a source-drain layer, wherein the negative power line and the source-drain layer are located in the same layer and are formed of the same material; and
wherein the display substrate further comprises a conductive layer disposed on the negative power line and located in the peripheral area, and the conductive layer electrically connects the cathode with the negative power line.

2. The display substrate according to claim 1, wherein an orthographic projection of the trench on the base substrate falls within an orthographic projection of the negative power line on the base substrate.

3. The display substrate according to claim 2, wherein the negative power line surrounds the display area, and the trench surrounds the display area.

4. The display substrate according to claim 3, wherein the negative power line comprises a first segment of negative power line, a second segment of negative power line, and a third segment of negative power line which are successively arranged in sequence, and the side of the base substrate comprises a first side, a second side and a third side which are successively arranged in sequence, the first segment of negative power line extends along the first side of the base substrate, the second segment of negative power line extends along the second side of the base substrate, and the third segment of negative power line extends along the third side of the base substrate;
wherein the trench comprises a first segment of trench, a second segment of trench, and a third segment of trench which are successively arranged in sequence, the first segment of trench extends in an extending direction of the first negative electrode power line, and the second segment of trench extends in an extending direction of the second segment of negative power line, and the third segment of trench extends in an extending direction of the third segment of negative power line.

5. The display substrate according to claim 1, wherein the side of the insulating layer closed to the negative power line is provided with a plurality of trenches, and the plurality of trenches are arranged at intervals in a first direction parallel to the base substrate, the first direction is perpendicular to the side of the base substrate, and the plurality of trenches are parallel to each other.

6. The display substrate according to claim 5, wherein the plurality of trenches have the same width and are arranged at equal intervals.

7. The display substrate according to claim 1, wherein in a cross section of the negative power line perpendicular to the side of the base substrate, the negative power line comprises a first portion and a second portion, the first portion extends in a first direction parallel to the base substrate and perpendicular to the side of the base substrate, and second portion extends in a second direction perpendicular to the base substrate, the first portion is located at a bottom of the trench, and the second portion is located on a sidewall of the trench.

8. The display substrate according to claim 7, wherein the negative power line further comprises a third portion extending in the first direction, the third portion is located on the insulating layer, and is not located in the trench, and the second portion connects the first portion with the third portion.

9. The display substrate according to claim 1, wherein the trench penetrates the insulating layer.

10. The display substrate according to claim 1, further comprising a metal layer disposed between the base substrate and the insulating layer and located in the peripheral area, wherein the negative power line is electrically connected to the metal layer at the trench.

11. The display substrate according to claim 9, wherein the insulating layer comprises at least one layer selected from the group consisting of a barrier layer, a buffer layer, a first insulating layer, a second insulating layer, and an interlayer dielectric layer which are sequentially disposed on the base substrate.

12. The display substrate according to claim 1, wherein the conductive layer and the anode are located in the same layer and are formed of the same material.

* * * * *